United States Patent
Nakano et al.

(10) Patent No.: US 12,442,066 B2
(45) Date of Patent: Oct. 14, 2025

(54) SUBSTRATE PROCESSING METHOD

(71) Applicant: SCREEN Holdings Co., Ltd., Kyoto (JP)

(72) Inventors: Teppei Nakano, Ismaning (DE); Takayoshi Tanaka, Kyoto (JP); Shota Iwahata, Ismaning (DE); Hiroyuki Yashiki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/361,277

(22) Filed: Jul. 28, 2023

(65) Prior Publication Data
US 2024/0035141 A1 Feb. 1, 2024

(30) Foreign Application Priority Data

Jul. 29, 2022 (JP) .................................. 2022-122032

(51) Int. Cl.
  *C23C 8/12* (2006.01)
  *C23C 8/80* (2006.01)
  *C23F 1/00* (2006.01)

(52) U.S. Cl.
  CPC .................. *C23C 8/12* (2013.01); *C23C 8/80* (2013.01); *C23F 1/00* (2013.01)

(58) Field of Classification Search
  CPC ............... C23C 8/12; C23C 8/80; C23F 1/00
  See application file for complete search history.

(56) References Cited

U.S. PATENT DOCUMENTS

| | | | |
|---|---|---|---|
| 9,611,152 B2 * | 4/2017 | Abboudi | B82Y 30/00 |
| 10,892,177 B2 | 1/2021 | Iwasaki et al. | |
| 2002/0081847 A1 * | 6/2002 | Jo | C23F 1/18 |
| | | | 257/E21.414 |

(Continued)

FOREIGN PATENT DOCUMENTS

| | | |
|---|---|---|
| JP | 2000-091331 A | 3/2000 |
| JP | 2022-509816 A | 1/2022 |

(Continued)

OTHER PUBLICATIONS

Pacco, Antoine, et al., "Etching of molybdenum via a combination of low-temperature ozone oxidation and wet-chemical oxide dissolution". J. Vac. Sci. Technol. A 41, 032601 (2023) pp. 1-8.*

(Continued)

*Primary Examiner* — Bret P Chen
(74) *Attorney, Agent, or Firm* — OSTROLENK FABER LLP

(57) ABSTRACT

A substrate processing method includes an oxidation step of heating a plurality of substrates inside an oxidation space while supplying an oxygen gas or an ozone gas to the plurality of substrates to change surface layers of molybdenum films to molybdenum trioxide, a first transfer step of transferring the plurality of substrates inside the oxidation space to an etching space inside the substrate processing apparatus differing from the oxidation space, and an etching step of supplying an etching liquid to the plurality of substrates inside the etching space to make the surface layers that changed to the molybdenum trioxide dissolve in the etching liquid while leaving, on the substrate, portions other than the surface layers of the molybdenum films.

9 Claims, 14 Drawing Sheets

(56) References Cited

U.S. PATENT DOCUMENTS

| | | | |
|---|---|---|---|
| 2005/0266605 A1 | 12/2005 | Kawakami | |
| 2010/0279439 A1* | 11/2010 | Shah | H01L 21/67259 |
| | | | 348/95 |
| 2013/0303414 A1* | 11/2013 | Ramm | C10M 103/06 |
| | | | 508/108 |
| 2016/0013438 A1* | 1/2016 | Im | H10K 71/00 |
| | | | 257/762 |
| 2018/0294187 A1* | 10/2018 | Thombare | H01L 21/76843 |
| 2019/0228966 A1* | 7/2019 | Wang | H01L 21/306 |
| 2019/0361001 A1* | 11/2019 | Dhanekar | A61B 5/082 |
| 2020/0303207 A1 | 9/2020 | Higuchi et al. | |
| 2021/0398817 A1 | 12/2021 | Takezawa et al. | |
| 2022/0059325 A1 | 2/2022 | Jin et al. | |
| 2022/0148882 A1 | 5/2022 | Abel et al. | |
| 2022/0148885 A1* | 5/2022 | Abel | C23G 5/036 |
| 2023/0093011 A1 | 3/2023 | Fischer et al. | |
| 2023/0207328 A1 | 6/2023 | Musselwhite et al. | |
| 2024/0038544 A1* | 2/2024 | Kawarazaki | H01L 21/6708 |

FOREIGN PATENT DOCUMENTS

| | | | |
|---|---|---|---|
| KR | 10-2021-0122459 A | 10/2021 | |
| KR | 10-2021-0157333 A | 12/2021 | |
| TW | 202147431 A | 12/2021 | |
| TW | 202205361 A | 2/2022 | |
| WO | WO 2014/108841 A1 * | 7/2014 | C01G 39/00 |
| WO | WO 2015/108842 A1 | 7/2015 | |
| WO | WO 2020/112237 A1 | 6/2020 | |
| WO | WO 2022/179680 A1 | 9/2022 | |

OTHER PUBLICATIONS

Guimond, S., et al., "Well-Ordered Molybdenum Oxide Layers on Au(111): Preparation and Properties". The Journal of Physical Chemistry C, 2013, 117, 8746-8757.*

Zeng, H.C., "Chemical Etching of Molybdenum Trioxide: A New Tailor-Made Synthesis of MoO 3Catalysts". Inorganic Chemistry 1998, 37, 1967-1973.*

Diskus, Madeleine, et al., "Growth of thin films of molybdenum oxide by atomic layer deposition". Journal of Materials Chemistry, 2011, 21, 705-710.*

Maruyama, Toshiro, et al., "Electrochromic Properties of Molybdenum Trioxide Thin Films Prepared by Chemical Vapor Deposition". J. Electrochem. 800., vol. 142, No. 5, May 1995, pp. 1644-1647.*

McEvoy, Todd M., et al., "Electrochemical Preparation of Molybdenum Trioxide Thin Films: Effect of Sintering on Electrochromic and Electroinsertion Properties". Langmuir, 2003, 19, 4316-4326.*

Epifani, Mauro, et al., "Synthesis and Characterization of MoO 3 Thin Films andPowders from a Molybdenum Chloromethoxide". Chem. Mater. 2004, 16, 5495-5501.*

Li, Yanping, et al., "A simple synthesis method to prepare a molybdenum oxide hole-transporting layer for efficient polymer solar cells".*

* cited by examiner

⇩ Oxidation

⇩ Etching

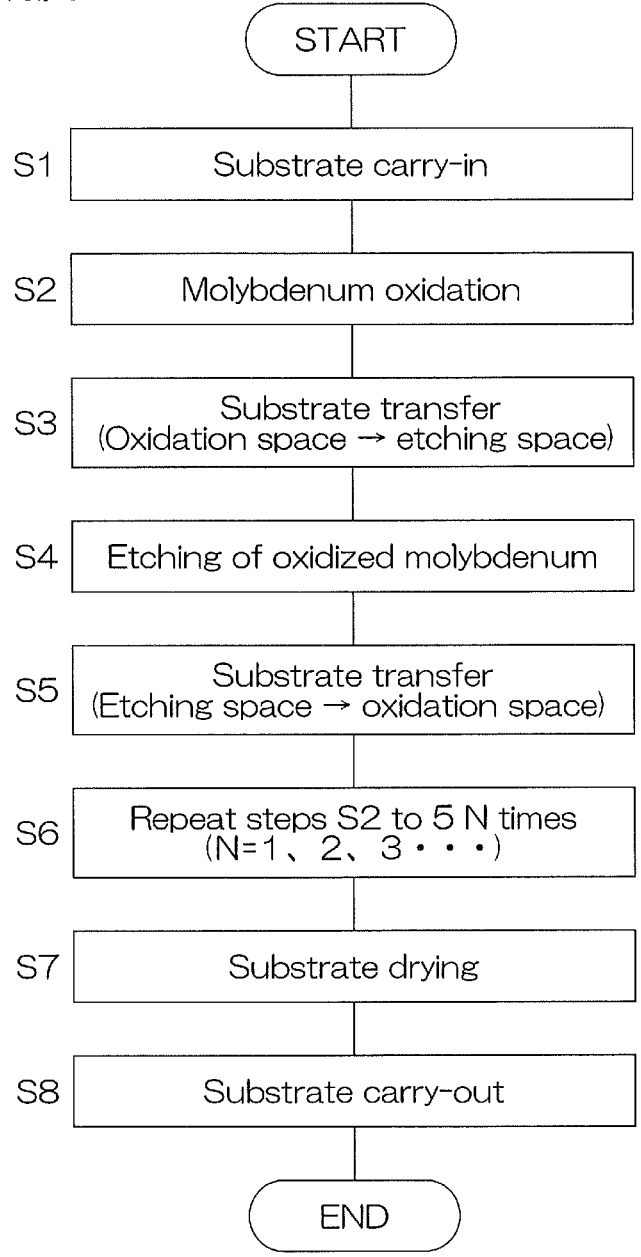

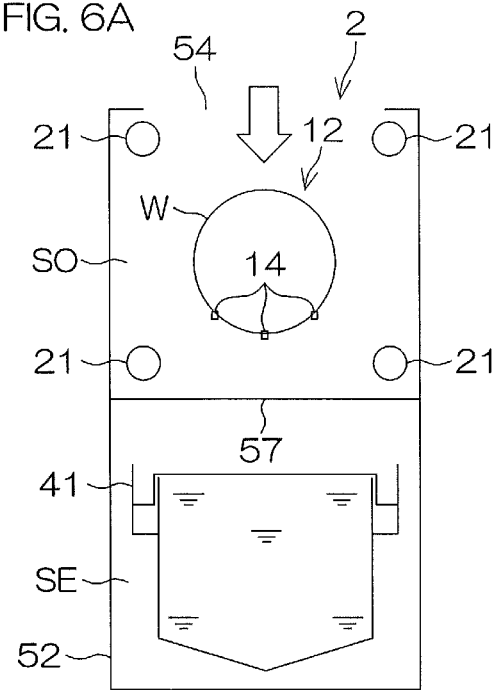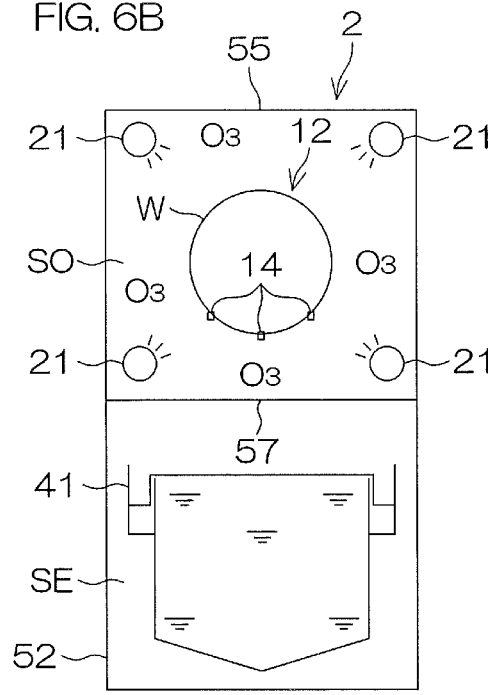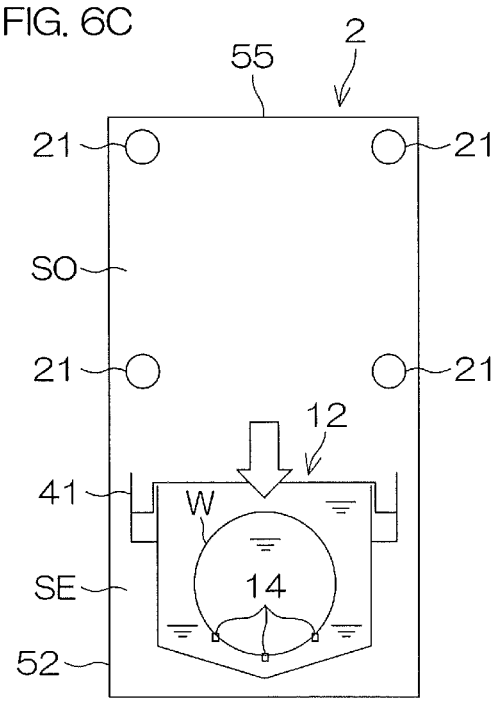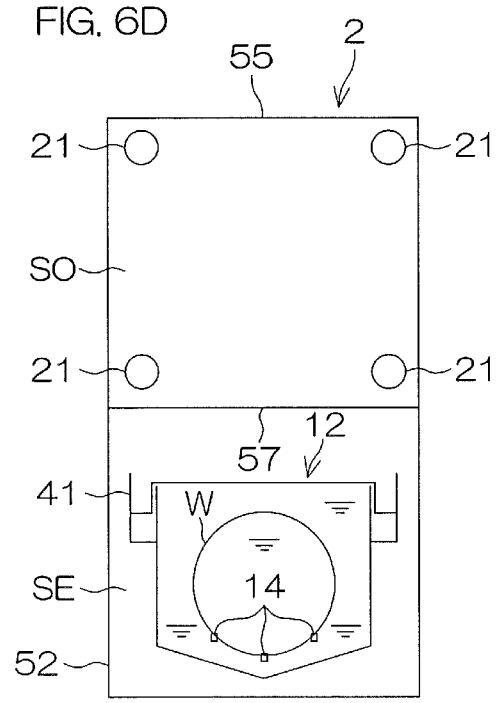

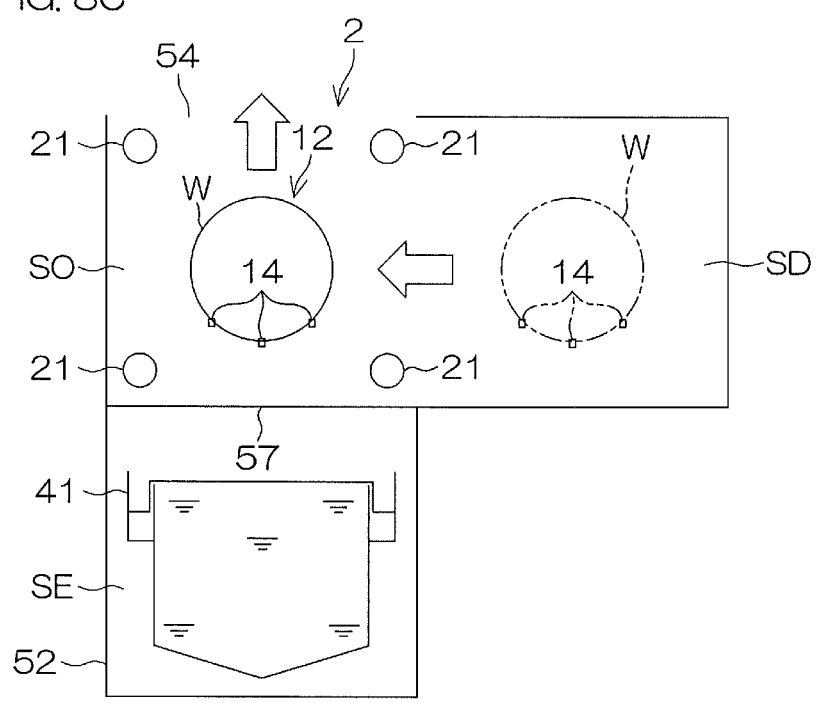

SUBSTRATE PROCESSING METHOD

CROSS REFERENCE TO RELATED APPLICATIONS

This application claims the benefit of priority to Japanese Patent Application No. 2022-122032 filed on Jul. 29, 2022. The entire contents of this application are hereby incorporated herein by reference.

BACKGROUND OF THE INVENTION

1. Field of the Invention

The present invention relates to a substrate processing method and a substrate processing apparatus that process a substrate. Examples of substrates include a semiconductor wafer, a substrate for a flat panel display (FPD) such as a liquid crystal display and an organic electroluminescence (organic EL) display, a substrate for an optical disc, a substrate for a magnetic disc, a substrate for a magneto-optical disc, a substrate for a photomask, a ceramic substrate, a substrate for a solar cell, and the like.

2. Description of Related Art

Japanese Translation of International Application (Kohyo) No. 2022-509816 disclose that forming a molybdenum oxide portion by oxidizing a molybdenum layer using oxygen ion implantation or oxygen plasma doping and that removing the molybdenum oxide portion from a substrate while leaving a non-oxidized molybdenum layer on the substrate by performing wet etching that supplies a liquid such as an ammonia solution, etc., to the substrate.

Although Japanese Translation of International Application (Kohyo) No. 2022-509816 discloses the oxidizing of the molybdenum layer by oxygen ion implantation or oxygen plasma doping, it does not disclose oxidizing of the molybdenum layer by a method other than these. If it is desired to oxidize the molybdenum layer by a method other than the above, such a need cannot be answered by the disclosure of Japanese Translation of International Application (Kohyo) No. 2022-509816.

SUMMARY OF THE INVENTION

A preferred embodiment of the present invention provides a substrate processing method including an oxidation step of heating a plurality of substrates disposed in an oxidation space inside a substrate processing apparatus while supplying an oxygen gas or an ozone gas to the plurality of substrates inside the oxidation space to change, in each of the plurality of substrates, a surface layer of a molybdenum film formed on the substrate to molybdenum trioxide without changing a portion other than the surface layer of the molybdenum film to the molybdenum trioxide, a first transfer step of transferring the plurality of substrates inside the oxidation space to an etching space inside the substrate processing apparatus differing from the oxidation space, and an etching step of supplying an etching liquid to the plurality of substrates inside the etching space to make, in each of the plurality of substrates, the surface layer that changed to the molybdenum trioxide dissolve in the etching liquid while leaving, on the substrate, the portion other than the surface layer of the molybdenum film.

With this method, the plurality of substrates are heated while supplying the oxygen gas or the ozone gas to the plurality of substrates in a state where the plurality of substrates are disposed in the oxidation space inside the substrate processing apparatus. Thereby, oxygen atoms contained in the oxygen gas or the ozone gas bond with molybdenum and the surface layers of the molybdenum films change to molybdenum trioxide. Thereafter, the plurality of substrates are transferred from the oxidation space inside the substrate processing apparatus to the etching space inside the substrate processing apparatus and the etching liquid is supplied to the plurality of substrates inside the etching space. The molybdenum trioxide dissolves in the etching liquid. Therefore, the surface layers of the molybdenum films that have changed to the molybdenum trioxide are etched while the portions other than the surface layers of the molybdenum films that have not changed to the molybdenum trioxide remain on the substrates.

Thus, it is possible to oxidize the molybdenum films formed on the substrates by heating the substrates while supplying the oxygen gas or the ozone gas to the substrates. Further, since the oxidation and the etching of the molybdenum films are performed inside the single substrate processing apparatus, a time required to transfer the substrates can be shortened in comparison to a case where the oxidation of the molybdenum films and the etching of the molybdenum oxide films are performed in separate substrate processing apparatuses. In addition, since the plurality of substrates are oxidized in a batch and etched in a batch, a time required for oxidation and etching can be shortened in comparison to a case where the plurality of substrates are oxidized one by one and etched one by one.

The oxygen gas and the ozone gas are oxygen-atom-containing gases that contains oxygen atoms. The supplying of the oxygen-atom-containing gas to the substrates may be performed by filling the oxidation space with the oxygen-atom-containing gas or by discharging the oxygen-atom-containing gas inside the oxidation space. In the latter case, the oxygen-atom-containing gas may fill the oxidation space or a gas other than the oxygen-atom-containing gas may be present in the oxidation space. That is, as long as an amount of oxygen atoms that is sufficient to change the molybdenum to the molybdenum trioxide is supplied to surfaces of the molybdenum films, the oxygen-atom-containing gas may be supplied to the substrates in any way.

In the preferred embodiment, at least one of the following features may be added to the substrate processing method.

In the oxidation step, the plurality of substrates inside the oxidation space are heated while supplying the ozone gas to the plurality of substrates inside the oxidation space.

By this method, the substrates are heated while supplying not the oxygen gas but the ozone gas to the substrates. Therefore, in comparison to a case of heating the substrates while supplying the oxygen gas to the substrates, the surface layers of the molybdenum films can be changed to the molybdenum trioxide efficiently. Thereby, a time for changing the surface layers of the molybdenum films to the molybdenum trioxide can be shortened and a throughput (number of substrates processed per unit time) of the substrate processing apparatus can be increased.

The etching liquid is a water-containing liquid having water as a main component.

By this method, the water-containing liquid having water as the main component is supplied to the substrates to etch the substrates. Whereas the molybdenum trioxide dissolves in water, the molybdenum does not dissolve or hardly dissolves in water. The surface layers of the molybdenum films that have changed to the molybdenum trioxide can therefore be removed from the substrates without using a chemical liquid. Thereby, treatment of waste liquid can be simplified and a load on the environment can be lightened in comparison to a case where the etching liquid is a chemical liquid.

The water-containing liquid corresponding to the etching liquid may be water (liquid with which a volume concentration of water is 100% or practically 100%) such as pure water, etc., or may be a liquid with which the volume concentration of water is not less than 90% but less than 100%. In the latter case, a chemical may be dissolved in the water-containing liquid if it is of low concentration. In this case, the surface layers of the molybdenum films that have changed to the molybdenum trioxide can be removed from the substrate in a shorter time.

The substrate processing method further includes a second transfer step of transferring the plurality of substrates inside the etching space to the oxidation space and in the substrate processing method, a single cycle that includes the oxidation step, the first transfer step, the etching step, and the second transfer step is performed a plurality of times.

By this method, after the etching liquid has been supplied to the plurality of substrates inside the etching space, the plurality of substrates are transferred to the oxidation space and the plurality of molybdenum films formed on the plurality of substrates are oxidized. That is, the oxidation of the molybdenum films and the etching of the molybdenum oxide films are repeated alternately a plurality of times. Thereby, thicknesses of the molybdenum films can be decreased in steps and the thicknesses of the molybdenum films can be adjusted in steps.

If the single cycle that includes the oxidation step, the first transfer step, the etching step, and the second transfer step is performed a plurality of times, the thicknesses of the molybdenum oxide films formed in the oxidation step may be the same each time or may differ among the plurality of oxidation steps. Likewise, decrease amounts of the thicknesses of the molybdenum films in the etching step, that is, thicknesses of the molybdenum oxide films dissolved in the etching liquid may be the same each time or may differ among the plurality of etching steps.

In the oxidizing step, the plurality of substrates inside the oxidation space are heated while supplying the oxygen gas or the ozone gas to the plurality of substrates inside the oxidation space in a state where the plurality of substrates are held by a substrate holder, in the first transfer step, the substrate holder is moved from the oxidation space to the etching space to transfer the plurality of substrates inside the oxidation space to the etching space, and in the etching step, the etching liquid is supplied to the plurality of substrates inside the etching space in the state where the plurality of substrates are held by the substrate holder.

By this method, the plurality of molybdenum films are oxidized, the plurality of substrates are transferred from the oxidation space to the etching space, and the plurality of molybdenum oxide films are etched in the state where the plurality of substrates are held by the substrate holder. That is, in order to perform the oxidation of the molybdenum films, the transfer of the substrates from the oxidation space to the etching space, and the etching of the molybdenum oxide films, there is no need to move the plurality of substrates held by the substrate holder to another substrate holder and there is also no need to provide a plurality of substrate holders. The throughput of the substrate processing apparatus can thereby be increased.

In the first transfer step, after moving a first inner partition that forms a portion of the oxidation space and a portion of the etching space, the plurality of substrates inside the oxidation space are transferred to the etching space through a space in which the first inner partition was disposed.

By this method, the first inner partition is disposed between the oxidation space and the etching space and forms a portion of a contour of the oxidation space and a portion of a contour of the etching space. At least a portion of the oxidation space is partitioned off from the etching space by just the first inner partition. When the first inner partition is moved, it becomes possible to move the plurality of substrates between the oxidation space and the etching space. Since the oxidation space is disposed close to the etching space across just the first inner partition, a time for transferring the substrates to the etching space can be shortened and the throughput of the substrate processing apparatus can be increased.

The substrate processing method further includes a second transfer step of transferring the plurality of substrates inside the etching space to the oxidation space and a drying step of performing, after the supplying of the etching liquid to the plurality of substrates, drying of the plurality of substrates inside the oxidation space.

By this method, after supplying the etching liquid to the plurality of substrates, the plurality of substrates are moved from the etching space to the oxidation space. Thereafter, the plurality of substrates inside the oxidation space are dried. That is, the oxidation space serves in common as a drying space in which the substrates are dried and the oxidation and the drying of the molybdenum films are performed on the substrates inside the oxidation space. The substrate processing apparatus can thus be made compact in comparison to a case where a drying space separate from the oxidation space is provided.

If the single cycle that includes the oxidation step, the first transfer step, the etching step, and the second transfer step is performed a plurality of times, the drying step is performed on the plurality of substrates that have been transferred to the oxidation space by the second transfer step after the etching step of the final cycle.

The substrate processing method further includes a third transfer step of moving a second inner partition that forms a portion of a drying space inside the substrate processing apparatus differing from the oxidation space and the etching space and a portion of the oxidation space or the etching space and thereafter transferring the plurality of substrates inside the etching space to the drying space through a space in which the second inner partition was disposed and a drying step of performing, after the supplying of the etching liquid to the plurality of substrates, drying of the plurality of substrates inside the drying space.

By this method, the second inner partition is disposed between the oxidation space or the etching space and the drying space. At least a portion of the drying space is partitioned off from the oxidation space or the etching space by just the second inner partition. When the second inner partition is moved, the plurality of substrates can enter into the drying space and can exit from the drying space. Since the drying space is disposed close to the oxidation space or the etching space across just the second inner partition, a time for transferring the substrates to the drying space can be shortened and the throughput of the substrate processing apparatus can be increased. In addition, the structure of the substrate processing apparatus can be simplified in comparison to a case where the oxidation space or the etching space serves in common as the drying space.

If the single cycle that includes the oxidation step, the first transfer step, the etching step, and the second transfer step is performed a plurality of times, the drying step is performed on the plurality of substrates that have been transferred to the oxidation space by the third transfer step after the etching step of the final cycle.

The substrate processing method further includes a rinsing step of supplying, after the supplying of the etching liquid to the plurality of substrates, the plurality of substrates with a rinse liquid that is a liquid of the same name as the etching liquid but differs from the etching liquid.

By this method, after supplying the etching liquid to the plurality of substrates, the rinse liquid is supplied to the plurality of substrates. The etching liquid and particles adhered to the substrates can thereby be rinsed off with the rinse liquid. If the etching liquid and the rinse liquid are liquids of different types, a piping, etc., for the etching liquid and a piping, etc., for the rinse liquid must be provided. If both are liquids of the same name, separate pipings, etc., do not have to be provided and the structure of the substrate processing apparatus can be simplified.

Another preferred embodiment of the present invention provides a substrate processing apparatus including a partition that forms an oxidation space and an etching space, an oxidation means that heats a plurality of substrates disposed in the oxidation space while supplying an oxygen gas or an ozone gas to the plurality of substrates inside the oxidation space to change, in each of the plurality of substrates, a surface layer of a molybdenum film formed on the substrate to molybdenum trioxide without changing a portion other than the surface layer of the molybdenum film to the molybdenum trioxide, a transferring system that transfers the plurality of substrates inside the oxidation space to the etching space differing from the oxidation space, and an etching means that supplies an etching liquid to the plurality of substrates inside the etching space to make, in each of the plurality of substrates, the surface layer that changed to the molybdenum trioxide dissolve in the etching liquid while leaving, on the substrate, the portion other than the surface layer of the molybdenum film. By this arrangement, the same effects as the substrate processing method described above can be exhibited. At least one of the features related to the substrate processing method described above may be added to the substrate processing apparatus.

The above and other objects, features, and advantages of the present invention will become more apparent from the following detailed description of the preferred embodiments with reference to the attached drawings.

BRIEF DESCRIPTION OF THE DRAWINGS

FIG. 5 is a process chart for describing an example of processing of substrates according to the first preferred embodiment of the present invention.

FIGS. 6A to D are schematic sectional views showing states of the processing unit when the example of processing of the substrates shown in FIG. 5 is being performed.

FIG. 8C is a schematic sectional view showing a state of the processing unit when the example of processing of the substrates according to the second preferred embodiment is being performed.

DETAILED DESCRIPTION OF PREFERRED EMBODIMENTS

First, an outline of processing of a substrate W according to a first preferred embodiment of the present invention shall be described.

Figure 1A:
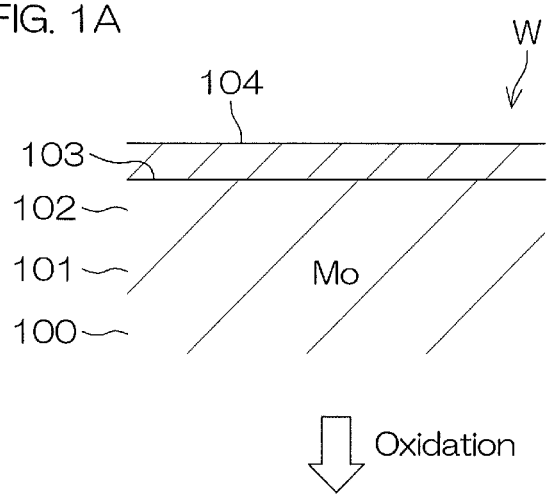
FIG. 1A is a schematic sectional view showing an example of a cross section of a substrate before processing of the substrate according to a first preferred embodiment of the present invention is performed.
Figure 1B:
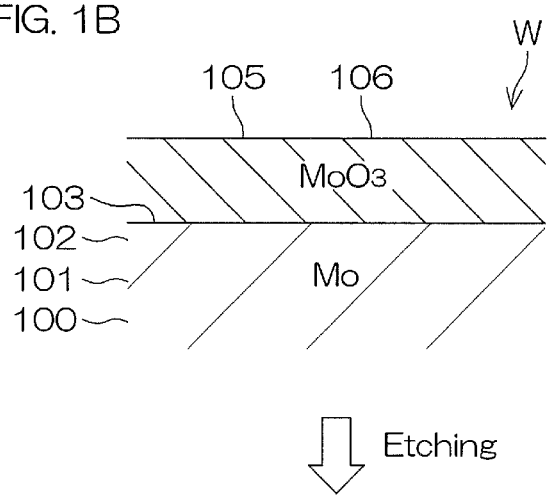
FIG. 1B is a schematic sectional view showing an example of the cross section of the substrate when the processing of the substrate according to the first preferred embodiment of the present invention is being performed.
Figure 1C:
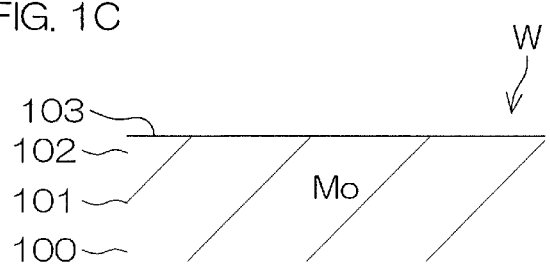
FIG. 1C is a schematic sectional view showing an example of the cross section of the substrate after the processing of the substrate according to the first preferred embodiment of the present invention has been performed.

FIG. 1A is a schematic sectional view showing an example of a cross section of the substrate W before processing of the substrate W according to the first preferred embodiment of the present invention is performed. FIG. 1B is a schematic sectional view showing an example of the cross section of the substrate W when the processing of the substrate W according to the first preferred embodiment of the present invention is being performed. FIG. 1C is a schematic sectional view showing an example of the cross section of the substrate W after the processing of the substrate W according to the first preferred embodiment of the present invention has been performed.

A molybdenum film 100 is a thin film made of molybdenum that is formed on a front surface of the substrate W such as a semiconductor wafer, etc. The molybdenum film 100 may be a portion of a metal wiring (molybdenum wiring) that is electrically connected to a transistor or other device formed on the substrate W. The metal wiring may be a metal wiring layer disposed on an interlayer insulating film or may be a metal plug disposed inside a via hole or other hole penetrating through at least one interlayer insulating film or may be both a metal wiring layer and a metal plug.

As shown in FIG. 1A, the molybdenum film 100 is constituted of a surface layer 102 that includes an entire region of a front surface 103 of the molybdenum film 100 and bulk 101 that represents a portion other than the surface layer 102 of the molybdenum film 100. The surface layer 102 of the molybdenum film 100 represents a layer of fixed or substantially fixed thickness from the front surface 103 of the molybdenum film 100. Before the substrate W is processed, the front surface 103 of the molybdenum film 100 may be covered or may be not covered by an oxide of molybdenum. Before the substrate W is processed, the front surface 103 of the molybdenum film 100 or a front surface of the oxide of molybdenum may be covered or may not be covered partially by another substance such as a resist pattern, etc.

FIG. 1A shows an example where the front surface 103 of the molybdenum film 100 is covered by a natural oxide film 104 of molybdenum that contains molybdenum oxide ($MoO_2$) and molybdenum trioxide ($MoO_3$). Molybdenum oxide and molybdenum trioxide are both examples of oxides of molybdenum. With the example shown in FIG. 1A, a portion of or the entire front surface 103 of the molybdenum film 100 is covered by the natural oxide film 104 of molybdenum. The natural oxide film 104 of molybdenum is exposed at the front surface of the substrate W such as a semiconductor wafer, etc., and is in contact with an atmosphere inside a space in which the substrate W is disposed.

In the processing of the substrate W according to the first preferred embodiment of the present invention, an oxidation step of heating the substrate W while supplying an ozone gas or other oxygen-atom-containing gas to the substrate W is performed. The ozone gas is an example of an oxygen-atom-containing gas that contains oxygen atoms. The oxygen-atom-containing gas may instead be an oxygen gas. If the natural oxide film 104 or other oxide of molybdenum is formed on the molybdenum film 100, the oxide of molybdenum may be removed from the molybdenum film 100 by wet etching or dry etching before performing the oxidation step or the oxidation step may be performed without removing the oxide of molybdenum.

When performing the oxidation step, the substrate W may be heated by contact heating or non-contact heating or the substrate W may be heated by both contact heating and non-contact heating. If the substrate W is to be heated by contact heating, a lower surface of the substrate W may be put in contact with a hot plate of higher temperature than room temperature (a fixed or substantially fixed temperature within 15 to 30° C.) by disposing the substrate W horizontally on the hot plate in a state where the front surface of the substrate W on which the device is formed is faced upward. If the substrate W is to be heated by non-contact heating, electromagnetic waves emitted from a lamp or other heat source may be irradiated on the substrate W. When performing the oxidation step, the substrate W may be in a horizontal or vertical orientation or may be in an orientation other than these.

When the oxidation step is performed, the molybdenum inside the molybdenum film 100 is oxidized by ozone or oxygen molecules inside the atmosphere in contact with the substrate W and the front surface 103 of the molybdenum film 100 changes to molybdenum trioxide. If the front surface 103 of the molybdenum film 100 is covered by the natural oxide film 104 or other oxide of molybdenum, not just the front surface 103 of the molybdenum film 100 but the oxide of molybdenum also changes to the molybdenum trioxide. Thereby, a molybdenum oxide film 105 that contains the molybdenum trioxide is formed on the front surface 103 of the molybdenum film 100 as shown in FIG. 1B.

The molybdenum film 100 changes to the molybdenum trioxide gradually from the front surface 103 of the molybdenum film 100 toward an interior of the molybdenum film 100. A boundary between the molybdenum film 100 and the molybdenum oxide film 105 moves gradually toward the interior of the molybdenum film 100. A thickness of the molybdenum oxide film 105 thereby increases continuously. When a time of performing the oxidation step reaches a maximum growth time to be described later, the molybdenum oxide film 105 of a maximum thickness to be described later is formed on the front surface 103 of the molybdenum film 100.

The molybdenum oxide film 105 is a thin film of the molybdenum trioxide bonded to the molybdenum film 100. The molybdenum oxide film 105 may contain molybdenum oxide or other substance besides the molybdenum trioxide. FIG. 1B shows an example where an entire region of a front surface 106 of the molybdenum oxide film 105 is flat and the thickness of the molybdenum oxide film 105 is uniform. The molybdenum oxide film 105 is thinner than the molybdenum film 100. The thickness of the molybdenum oxide film 105 may instead be not less than the thickness of the molybdenum film 100.

The time of performing the oxidation step (time of heating the substrate W while putting the ozone gas or other oxygen-atom-containing gas in contact with the substrate W) is defined as the oxidation time and conditions of the oxidation step excluding the oxidation time are defined as oxidation conditions, respectively. A plurality of parameters are included in the oxidation conditions. For example, a temperature of the substrate W, a concentration of the ozone gas supplied to the substrate W, and a flow rate of the ozone gas supplied to the substrate W are included in the oxidation conditions. The oxidation time is not included in the oxidation conditions.

The oxidation conditions when the oxygen-atom-containing gas is the ozone gas are as follows. Specifically, the temperature of the substrate W is not less than 150° C. and is, for example, within a range of 180 to 300° C. The concentration of the ozone gas is not less than 50 g/m$^3$ and is, for example, within a range of 100 to 200 g/m$^3$. The flow rate of the ozone gas is not less than 5 SLM (standard liter min) and is, for example, within a range of 18 to 200 SLM. The oxidation time is not less than 30 seconds and is, for example, within a range of 30 to 300 seconds. An etching time to be described later is not less than 30 seconds. A difference between the thickness of the molybdenum film 100 before performing the oxidation step and the thickness of the molybdenum film 100 after performing an etching step is defined as a recess amount. Although depending on the oxidation conditions, the recess amount when the oxidation step and the etching step are performed once each is less than several dozen nm and is, for example, less than 10 nm. The aforementioned numerical values are an example and there are no restrictions thereto.

If the oxidation conditions are fixed, the thickness of the molybdenum oxide film 105 increases as the oxidation time increases. If the oxidation conditions are fixed, even when the oxidation time exceeds the maximum growth time, the thickness of the molybdenum oxide film 105 does not change or hardly changes and stays at or near the maximum thickness. That is, if the oxidation conditions are fixed, although the thickness of the molybdenum oxide film 105 reaches the maximum thickness when the oxidation time reaches the maximum growth time, the thickness of the molybdenum oxide film 105 does not change or hardly changes even if the oxidation step is continued for a longer time. This phenomenon is referred to at times as self-limitation.

The maximum thickness of the molybdenum oxide film 105 depends on the oxidation conditions. The maximum growth time also depends on the oxidation conditions. When an oxidation condition changes, the maximum thickness of the molybdenum oxide film 105 increases or decreases accordingly. For example, when the temperature of the substrate W drops, the maximum thickness of the molybdenum oxide film 105 decreases. The maximum thickness of the molybdenum oxide film 105 also decreases when the concentration or the flow rate of the ozone gas supplied to the substrate W decreases.

After the oxidation step has been performed, the etching step of supplying an etching liquid to the substrate W to remove the molybdenum oxide film 105 from the substrate W is performed as shown in FIG. 1C. FIG. 1C shows an example where the entire molybdenum oxide film 105 is removed by the supplying of the etching liquid and the flat front surface 103 of the molybdenum film 100 formed of molybdenum is exposed. Although it is preferable for the entire molybdenum oxide film 105 to be removed from the substrate W by the supplying of the etching liquid, the molybdenum oxide film 105 may remain on the substrate W if it is of a degree that does not present a problem in a subsequent step.

The etching liquid is a liquid that dissolves the molybdenum trioxide but does not dissolve or hardly dissolves the molybdenum. Whereas the molybdenum trioxide dissolves in water, the molybdenum does not dissolve or hardly dissolves in water. In other words, a rate at which the molybdenum trioxide dissolves in water is greater than a rate at which molybdenum dissolves in water. The etching liquid may therefore be any liquid as long as it is a liquid that contains water. For example, the etching liquid may be water such as pure water (DIW (deionized water)), etc., or may be an aqueous solution such as ammonium hydroxide, alkaline solution, carbonated water, hydrofluoric acid, hydrochloric acid, etc. A proportion of water in the aqueous solution (proportion of water with respect to a solute) may be not less than 100 or may be less than 100.

When the etching liquid contacts the front surface 106 of the molybdenum oxide film 105, the molybdenum trioxide that constitutes the front surface 106 of the molybdenum oxide film 105 dissolves in the etching liquid and the molybdenum oxide film 105 thins gradually. When the etching time, that is, the time for which the etching liquid contacts the molybdenum oxide film 105 reaches an etching end time, all or nearly all of the molybdenum oxide film 105 dissolves in the etching liquid. The etching liquid is a liquid that dissolves the molybdenum trioxide but does not dissolve or hardly dissolves the molybdenum. Therefore, even if the supplying of the etching liquid is continued for not less than the etching end time, the molybdenum film 100 does not thin or hardly thins.

When performing the etching step, the etching liquid may be supplied continuously to the substrate W for not less than the etching end time or the etching liquid may be supplied intermittently to the substrate W such that a cumulative etching time that expresses a total value of the time for which the etching liquid contacts the molybdenum oxide film 105 is not less than the etching end time. Also, when performing the etching step, the orientation of the substrate W may be horizontal or vertical or may be tilted with respect to a horizontal plane. FIG. 1B shows an example where the etching step is performed while the substrate W is maintained horizontal.

If, instead of etching the molybdenum oxide film 105 with the etching liquid after changing the surface layer 102 of the molybdenum film 100 to the molybdenum oxide film 105, an etching liquid that corrodes the molybdenum is supplied to the molybdenum film 100, a roughness (coarseness) of the front surface 103 of the molybdenum film 100 may not satisfactory. If, as described above, the surface layer 102 of the molybdenum film 100 is changed to the molybdenum oxide film 105 and thereafter removed, the roughness of the molybdenum film 100 after etching can be improved (reduced) in comparison to a case where the molybdenum film 100 is etched directly with an etching liquid.

After all or nearly all of the molybdenum oxide film 105 has been removed from the substrate W, a drying step of drying the substrate W simply or completely is performed. That is, if, when performing the oxidation step for a second time or more as shall be described below, a liquid remaining on the substrate W will not present a problem in the oxidation step, etc., the substrate W may be dried simply such that nearly all of the liquid is removed from the substrate W before performing a subsequent oxidation step. Or, before performing the subsequent oxidation step, the substrate W may be dried completely such that all of the liquid is removed from the substrate W. If a concentration of a chemical contained in the etching liquid is high, the etching liquid may be rinsed off with pure water or other rinse liquid before drying the substrate W.

After the etching step has been performed, the oxidation step is performed for the second time in the same manner as described above and, thereafter, the etching step is performed for a second time. If necessary, the oxidation step and the etching step may be performed for a third time or the oxidation step and the etching step may be performed for a fourth time or more. That is, a single cycle of performing the oxidation step and the etching step in that order may be performed two times or more. Thereby, the thickness of the molybdenum film 100 can be decreased in steps. After a last etching step has been performed, the substrate W is dried completely.

As described above, in the oxidation step, whereas a portion of the molybdenum film 100 at the front surface 103 side changes to the molybdenum trioxide and the thickness of the molybdenum film 100 decreases, the molybdenum film 100 is not etched. If the thickness of the molybdenum oxide film 105 formed in the oxidation step of each time is fixed or substantially fixed, an etching amount will be zero in the oxidation step and the etching amount will be of a fixed or substantially fixed value that exceeds zero in the etching step. Such stepwise etching is also called digital etching.

Next, a substrate processing apparatus 1 shall be described.

Figure 2:
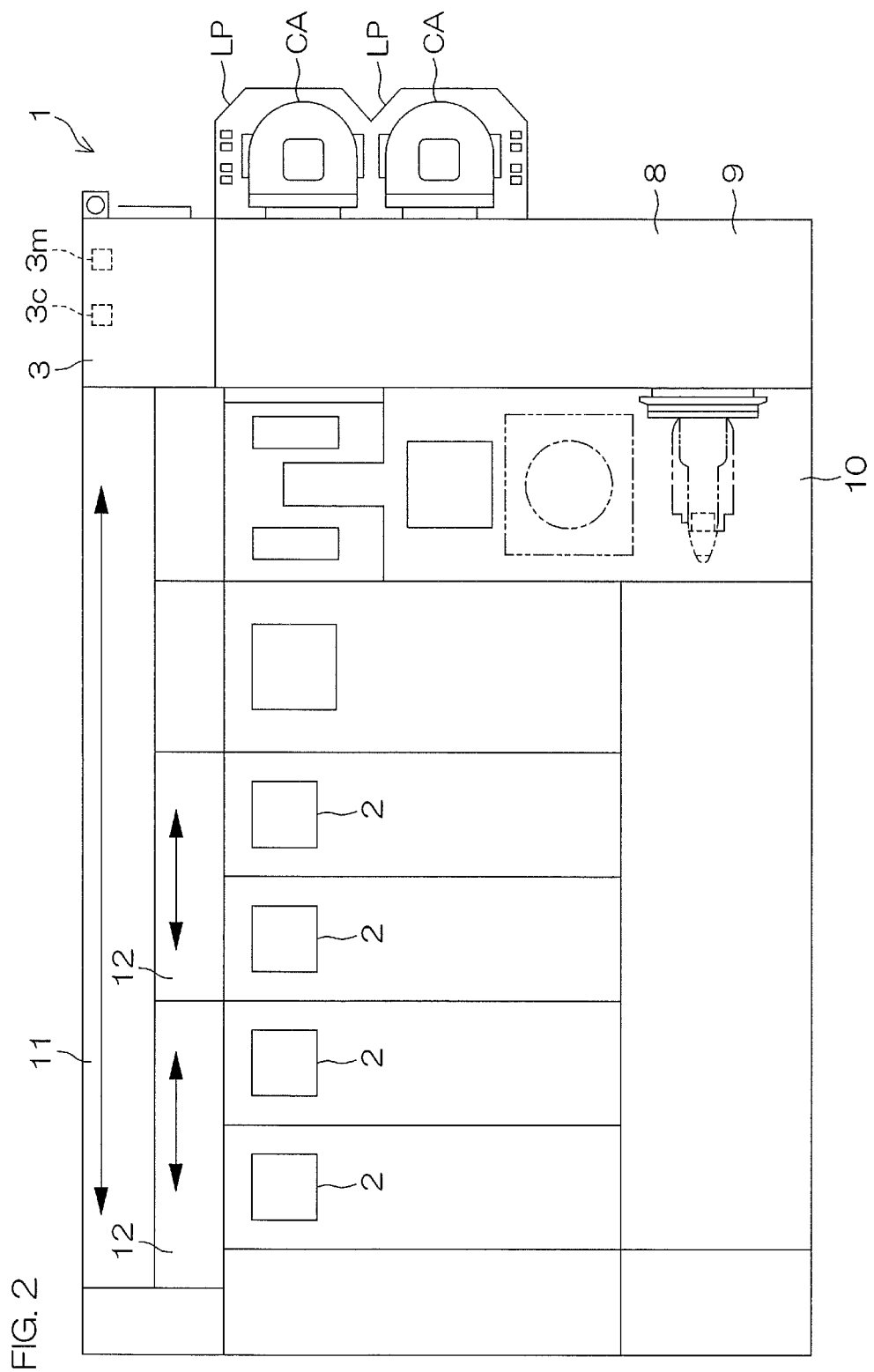
FIG. 2 is a schematic plan view showing a layout of a substrate processing apparatus of a batch type according to the first preferred embodiment of the present invention.

FIG. 2 is a schematic plan view showing a layout of the substrate processing apparatus 1 of a batch type according to the first preferred embodiment of the present invention.

The substrate processing apparatus 1 is an apparatus of the batch type that processes a plurality of substrates W in a batch. The substrate processing apparatus 1 includes load ports LP that each hold a carrier CA housing semiconductor wafers or other substrates W of disk shapes, processing units 2 that process the substrates W transferred from the load ports LP with processing liquids such as a chemical liquid, rinse liquid, etc., a transfer system 8 that transfers the substrates W between the load ports LP and the processing units 2, and a controller 3 that controls the substrate processing apparatus 1.

The controller 3 is a computer that includes a memory 3m that stores information such as a program, etc., and a CPU 3c (central processing unit) that controls the substrate processing apparatus 1 in accordance with the program stored in the memory 3m. The controller 3 controls the substrate processing apparatus 1 to perform transfer and processing, etc., of the substrates W to be described below. In other words, the controller 3 is programmed to perform the transfer and the processing, etc., of the substrates W to be described below.

The transfer system 8 includes a carrier transfer apparatus 9 that transfers the carriers CA between the load ports LP and the processing units 2 and houses a plurality of the carriers CA and an orientation converting robot 10 that performs carry-in and carry-out of a plurality of substrates W with respect to the carriers CA held by the carrier transfer apparatus 9 and changes orientations of the substrates W between a horizontal orientation and a vertical orientation. The orientation converting robot 10 performs a batching operation of forming a single batch with the plurality of substrates W taken out from the plurality of carriers CA and an unbatching operation of housing, in the plurality of carriers CA, the plurality of substrates W that are included in the single batch.

The transfer system 8 further includes a main transfer robot 11 that transfers the plurality of substrates W between the orientation converting robot 10 and the processing units 2 and a plurality of auxiliary transfer robots 12 that transfer the plurality of substrates W between the main transfer robot 11 and the processing units 2. FIG. 2 shows an example where two auxiliary transfer robots 12 and four processing units 2 are provided. In this example, the four processing units 2 are aligned in a straight line in a depth direction (direction in which the main transfer robot 11 transfers the substrates W) of the substrate processing apparatus 1 in plan view. One of the auxiliary transfer robots 12 is associated with two adjacent processing units 2 and the other auxiliary transfer robot 12 is associated with the remaining two adjacent processing units 2. Each auxiliary transfer robot 12 performs carry-in and carry-out of the plurality of substrates W with respect to each of the corresponding two associated processing units 2.

The main transfer robot 11 receives the single batch of substrates W that is constituted of the plurality (for example, 50) of substrates W from the orientation converting robot 10 and transfers the received single batch of substrates W to one of the plurality of auxiliary transfer robots 12. The auxiliary transfer robot 12 carries the single batch of substrates W received from the main transfer robot 11 into one of the processing units 2 and carries out the single batch of substrates W processed by the processing unit 2 from the processing unit 2. Thereafter, the main transfer robot 11 receives the single batch of substrates W from the auxiliary transfer robot 12 and transfers the received single batch of substrates W to the orientation converting robot 10.

The plurality of substrates W, with each of which the molybdenum film 100 or the natural oxide film 104 of molybdenum as shown in FIG. 1A is exposed, are transferred to the load port LP in a state of being housed in the carrier CA. Each processing unit 2 performs the single cycle, including the oxidation step and the etching step described above, a plurality of times on the plurality of substrates W transferred from the carrier CA on the load port LP. The plurality of substrates W processed by the processing unit 2 are carried into the carrier CA on the load port LP and are transferred from the load port LP in a state of being housed in the carrier CA. The substrates W that have been carried into the substrate processing apparatus 1 through the load port LP are thus processed by the processing unit 2 and carried out from the substrate processing apparatus 1 through the load port LP.

Figure 3A:
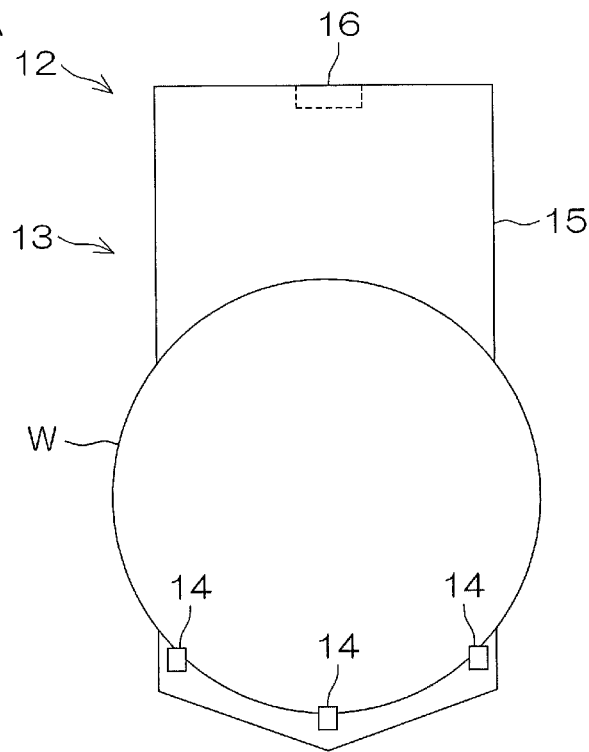
FIG. 3A is a schematic front view of an auxiliary transfer robot.
Figure 3B:
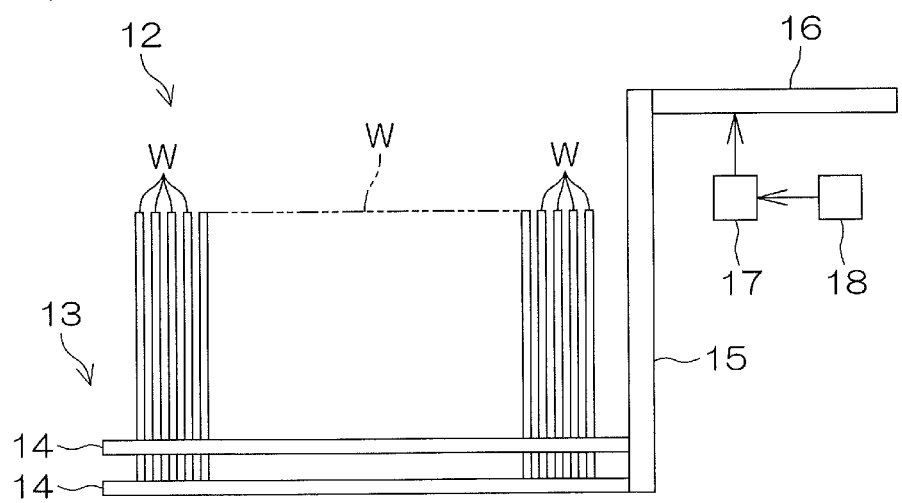
FIG. 3B is a schematic left side view of the auxiliary transfer robot.

The auxiliary transfer robots 12 shall now be described. FIG. 3A is a schematic front view of an auxiliary transfer robot 12. FIG. 3B is a schematic left side view of the auxiliary transfer robot 12. FIG. 3B is a diagram of viewing the auxiliary transfer robot 12 horizontally in the depth direction (direction in which the main transfer robot 11 transfers the substrates W) of the substrate processing apparatus 1 (see FIG. 2). FIG. 3A is a diagram of viewing the auxiliary transfer robot 12 horizontally in a width direction (horizontal direction orthogonal to the depth direction of the substrate processing apparatus 1) of the substrate processing apparatus 1.

As shown in FIG. 3A and FIG. 3B, the auxiliary transfer robot 12 includes a support frame 13 by which the plurality of substrates W transferred by the main transfer robot 11 (see FIG. 2) are held in the vertical orientation. The support frame 13 is an example of a substrate holder that holds the substrates W. The support frame 13 includes a plurality of support bars 14 that are disposed below the plurality of substrates W to be held. FIG. 3A shows an example where three support bars 14 are provided. The number of support bars 14 may be two instead.

The plurality of support bars 14 contact the plurality of substrates W to hold the plurality of substrates W in the vertical orientation such that the plurality of substrates W face each other at intervals in parallel. Each support bar 14 has a plurality of grooves formed therein that receive the plurality of substrates W one by one. The plurality of substrates W are placed on the plurality of support bars 14. In this state, outer peripheral portions of the respective substrates W fit in the grooves of the respective support bars 14 and are restricted in tilt with respect to the plurality of support bars 14. The respective substrates W are thereby maintained in the vertical orientation.

In addition to the plurality of support bars 14, the support frame 13 includes a base plate 15 to which the plurality of support bars 14 are fixed and an upper plate 16 that is fixed to the plurality of support bars 14 via the base plate 15. The plurality of support bars 14 extend horizontally from the base plate 15. The upper plate 16 is disposed at an opposite side of the plurality of support bars 14 with respect to the base plate 15. The upper plate 16 is disposed higher than the plurality of support bars 14. When the upper plate 16 is moved, the plurality of support bars 14 and the base plate 15 move in the same direction at the same speed as the upper plate 16.

The auxiliary transfer robot 12 corresponds to a lifter that elevates and lowers the plurality of substrates W while holding the plurality of substrates W. The auxiliary transfer robot 12 includes an elevating/lowering actuator 17 that moves the support frame 13 in parallel vertically. The auxiliary transfer robot 12 further includes a slide actuator 18 that moves the support frame 13 in parallel horizontally. A motive power of the elevating/lowering actuator 17 is transmitted to the plurality of support bars 14 via the upper plate 16 and the base plate 15. A motive power of the slide actuator 18 is transmitted to the plurality of support bars 14 via the elevating/lowering actuator 17, the upper plate 16, and the base plate 15.

When the elevating/lowering actuator 17 moves the support frame 13 in parallel vertically, the plurality of substrates W supported by the support frame 13 also move in parallel vertically. The plurality of substrates W supported by the support frame 13 are thereby transferred vertically. Similarly, when the slide actuator 18 moves the support frame 13 in parallel horizontally, the plurality of substrates W supported by the support frame 13 also move in parallel horizontally. The plurality of substrates W supported by the support frame 13 are thereby transferred horizontally.

The elevating/lowering actuator 17 is an actuator that moves the support frame 13 in parallel vertically. The actuator is a device that converts electrical, fluid, magnetic, heat, or chemical energy to mechanical work. The actuator includes an electric motor, air cylinder, and other devices. The elevating/lowering actuator 17 may be an electric motor or an air cylinder or may be other than these. The definition of an actuator is the same for other actuators such as the slide actuator 18, etc.

Next, the processing units 2 shall be described.

Figure 4A:
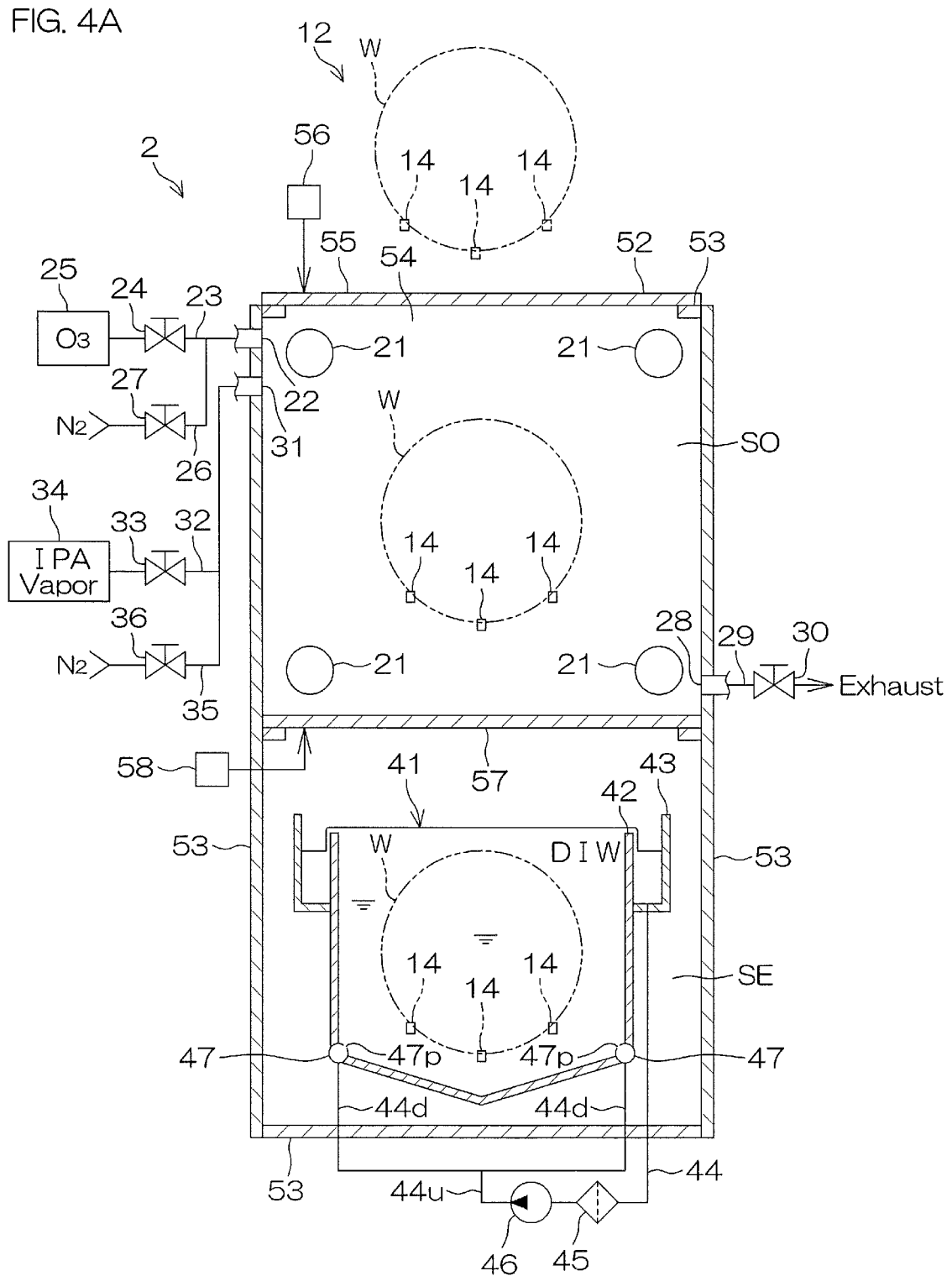
FIG. 4A is a schematic sectional view showing a vertical section of a processing unit.
Figure 4B:
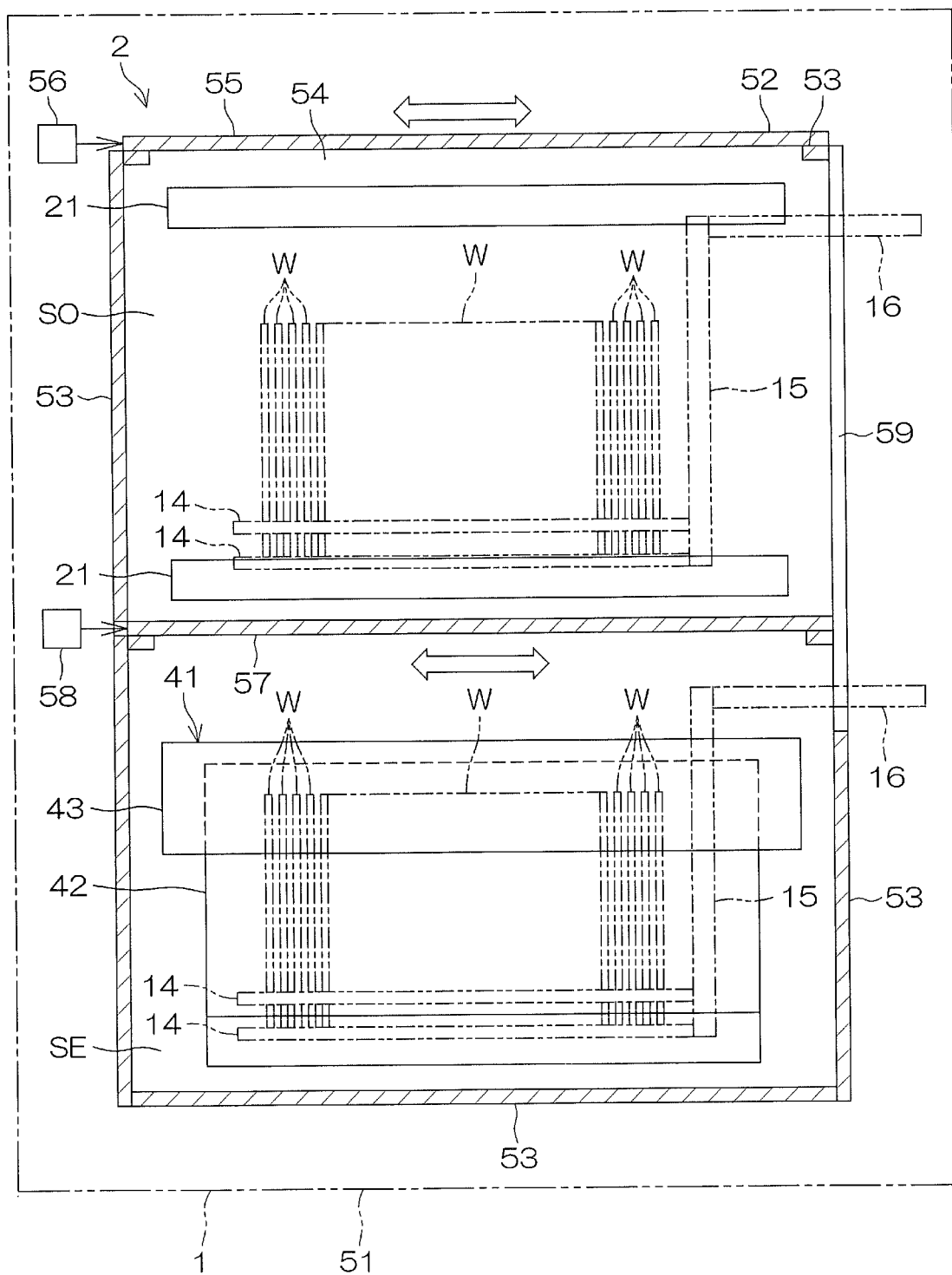
FIG. 4B is a schematic sectional view showing a vertical section of the processing unit.

FIG. 4A and FIG. 4B are schematic sectional views showing vertical sections of the processing unit 2. FIG. 4A shows a vertical section parallel to the plurality of substrates W held by the auxiliary transfer robot 12. FIG. 4B shows a vertical section perpendicular to the plurality of substrates W held by the auxiliary transfer robot 12.

As shown in FIG. 4A, the processing unit 2 includes a plurality of partitions 52 forming an internal space of the processing unit 2 that includes an oxidation space SO and an etching space SE. The processing unit 2 further includes at least one heating lamp 21 that irradiates light on the plurality of substrates W inside the oxidation space SO, an ozone gas supply port 22 that supplies the ozone gas to the plurality of substrates W inside the oxidation space SO, and a first processing tank 41 that stores, in the etching space SE, the etching liquid in which the plurality of substrates W are immersed. These arrangements shall be described below.

First, the heating of the substrates W and the supplying of the ozone gas shall be described.

The processing unit 2 includes the at least one heating lamp 21 that irradiates light on the plurality of substrates W inside the oxidation space SO to heat the plurality of substrates W at a heating temperature. The heating lamp 21 is an example of a heater that heats the plurality of substrates W inside the oxidation space SO. The heating lamp 21 may be a halogen lamp or may be an LED (light emitting diode) lamp or may be a lamp other than these. The heating lamp 21 includes a light source that emits light by being supplied with electric power and a transparent case that houses the light source.

FIG. 4A and FIG. 4B show an example where four heating lamps 21 are disposed in the single oxidation space SO. The number of heating lamps 21 that irradiate light on the substrates W inside the single oxidation space SO may be less than 4 or not less than 5. As long as light can be irradiated on the substrates W inside the oxidation space SO, the heating lamps 21 may be disposed outside the oxidation space SO. If the plurality of substrates W are disposed in the oxidation space SO, the light of at least one heating lamp 21 is irradiated on all of the substrates W inside the oxidation space SO. All of the substrates W inside the oxidation space SO are thereby heated without contact.

As shown in FIG. 4A, the processing unit 2 includes the ozone gas supply port 22 that supplies the ozone gas to the oxidation space SO. The ozone gas supply port 22 includes a space through which the ozone gas passes and an end surface (typically, an end surface of annular shape that surrounds an entire circumference of the space) that forms the space. As long as the ozone gas that flows out from ozone gas supply port 22 is supplied to the oxidation space SO, the ozone gas supply port 22 may be opened at a wall surface that forms the oxidation space SO or may be disposed further inward than the wall surface. FIG. 4A shows an example of the former.

In addition to the ozone gas supply port 22, the processing unit 2 includes an ozone gas generator 25 that generates the ozone gas to be supplied to the ozone gas supply port 22, an ozone gas piping 23 that guides ozone gas generated by the ozone gas generator 25 toward the ozone gas supply port 22, and an ozone gas valve 24 that opens and closes between an open state in which the ozone gas flows from the ozone gas piping 23 to the ozone gas supply port 22 and a closed state in which the ozone gas does not flow from the ozone gas piping 23 to the ozone gas supply port 22.

Although not illustrated, the ozone gas valve 24 includes a valve body that is provided with an internal flow passage through which a fluid flows and a valve seat with an annular shape forming a portion of the internal flow passage, a valve element that is movable with respect to the valve seat, and an actuator that moves valve element between a closed position at which the valve element contacts the valve seat and an open position at which the valve element is separated from the valve seat. The same also applies to other valves. The actuator may be a pneumatic actuator or an electric actuator or may be an actuator other than these. The controller 3 (see FIG. 2) controls the actuator to open and close the ozone gas valve 24.

The processing unit 2 further includes a first exhaust port 28 that exhausts a gas inside the oxidation space SO, a first exhaust piping 29 that guides the gas, which flowed into the first exhaust port 28, in a direction away from the oxidation space SO, and a first exhaust valve that opens and closes between an open state in which the gas inside the oxidation space SO flows into the first exhaust port 28 and a closed state in which the gas inside the oxidation space SO does not flow into the first exhaust port 28. The first exhaust port 28 includes a space through which the gas to be exhausted passes and an end surface that forms this space. As long as the first exhaust port 28 can exhaust the gas inside the oxidation space SO, the first exhaust port 28 may be opened at a wall surface that forms the oxidation space SO or may be disposed further inward than the wall surface.

When the ozone gas valve 24 is opened, the ozone gas flows out from the ozone gas supply port 22 and is supplied to the oxidation space SO. When the supplying of the ozone gas is continued in the state where the first exhaust valve 30 is open, the oxidation space SO becomes filled with the ozone gas. The filling of the oxidation space SO with the ozone gas may be performed by supplying the ozone gas to the oxidation space SO while exhausting the gas inside the oxidation space SO to the first exhaust port 28 or may be performed by supplying the ozone gas to the oxidation space SO after exhausting the gas inside the oxidation space SO to the first exhaust port 28.

After the oxidation space SO is filled with the ozone gas, the supplying of the ozone gas from the ozone gas supply port 22 and the exhausting of the gas to the first exhaust port 28 may be continued or may be stopped. In the former case, a gas pressure inside the oxidation space SO may be maintained at a value not less than or less than a gas pressure outside the oxidation space SO while filling the oxidation space SO with the ozone gas. In this case, the first exhaust valve 30 may be a relief valve that, when the gas pressure of the oxidation space SO rises to not less than a set value, makes the gas inside the oxidation space SO flow into the first exhaust port 28 until the gas pressure drops to less than the set value. The first exhaust valve 30 may include both an opening/closing valve and the relief valve.

The processing unit 2 includes a first inert gas piping 26 guiding a nitrogen gas that is an example of an inert gas to be supplied to the oxidation space SO and a first inert gas valve 27 opening and closing between an open state in which the nitrogen gas flows to the oxidation space SO from the first inert gas piping 26 and a closed state in which the nitrogen gas does not flow to the oxidation space SO from the first inert gas piping 26. FIG. 4A shows an example where the nitrogen gas inside the first inert gas piping 26 is supplied to the oxidation space SO via the ozone gas supply port 22. The nitrogen gas inside the first inert gas piping 26 may instead be supplied to the oxidation space SO via a supply port that is separate from the ozone gas supply port 22.

After the ozone gas is supplied to the oxidation space SO, the ozone gas inside the oxidation space SO is exhausted through the first exhaust port 28. Specifically, after the ozone gas is supplied to the oxidation space SO, the ozone gas valve 24 is closed and the first inert gas valve 27 is opened in a state where the first exhaust valve 30 is open. Thereby, the nitrogen gas is supplied to the oxidation space SO and the gas inside the oxidation space SO such as the ozone gas, etc., is exhausted to the first exhaust port 28. Consequently, the ozone gas inside the oxidation space SO is replaced by the nitrogen gas and the oxidation space SO is filled with the nitrogen gas.

The processing unit 2 includes a vapor supply port 31 that supplies, to the oxidation space SO, a vapor of an organic solvent that is higher in volatility than water and dissolves in water. The vapor supply port 31 includes a space through which the vapor of the organic solvent passes and an end surface that forms this space. As long as the vapor of the organic solvent that flows out from the vapor supply port 31 is supplied to the oxidation space SO, the vapor supply port 31 may be opened at a wall surface that forms the oxidation space SO or may be disposed further inward than the wall surface.

In addition to the vapor supply port 31, the processing unit 2 includes a vapor generator 34 that generates the vapor of the organic solvent to be supplied to the vapor supply port 31, a vapor piping 32 that guides the vapor of the organic solvent generated by the vapor generator 34 toward the vapor supply port 31, and a vapor valve 33 that opens and closes between an open state in which the vapor of the organic solvent flows to the vapor supply port 31 from the vapor piping 32 and a closed state in which the vapor of the organic solvent does not flow to the vapor supply port 31 from the vapor piping 32. FIG. 4A shows an example where the vapor of the organic solvent is a vapor of IPA (isopropyl alcohol). IPA is an example of an alcohol that includes a hydrophilic group and a hydrophobic group in the chemical formula.

When the vapor valve 33 is opened, the vapor of IPA flows out from the vapor supply port 31 and is supplied to the oxidation space SO. When the supplying of the vapor of IPA is continued in a state where the first exhaust valve is opened, the oxidation space SO becomes filled with the vapor of IPA. The filling of the oxidation space SO with the vapor of IPA may be performed by supplying the vapor of IPA to the oxidation space SO while exhausting the gas inside the oxidation space SO to the first exhaust port 28 or may be performed by supplying the vapor of IPA to the oxidation space SO after exhausting the gas inside the oxidation space SO to the first exhaust port 28.

After the oxidation space SO is filled with the vapor of IPA, the supplying of the vapor of IPA from the vapor supply port 31 and the exhausting of the gas to the first exhaust port 28 may be continued or may be stopped. In the former case, the gas pressure inside the oxidation space SO may be maintained at a value not less than or less than the gas pressure outside the oxidation space SO while filling the oxidation space SO with the vapor of IPA. In this case, the first exhaust valve 30 may be the relief valve that, when the gas pressure of the oxidation space SO rises to not less than the set value, makes the gas inside the oxidation space SO flow into the first exhaust port 28 until the gas pressure drops to less than the set value. The first exhaust valve 30 may include both an opening/closing valve and the relief valve.

When the oxidation space SO is filled with the vapor of IPA and a liquid such as pure water, etc., is adhered to the substrates W inside the oxidation space SO, the vapor of IPA contacts the substrates W and the liquid adhered to the substrates W is replaced by a liquid of IPA. The liquid of IPA that is adhered to the substrates W evaporates and is eliminated from the substrates W. The liquid adhered to the substrates W is thereby removed and the substrates W dries in the oxidation space SO that serves in common as a drying space.

The processing unit 2 includes a second inert gas piping 35 guiding a nitrogen gas that is an example of an inert gas to be supplied to the oxidation space SO and a second inert gas valve 36 opening and closing between an open state in which the nitrogen gas flows to the oxidation space SO from the second inert gas piping 35 and a closed state in which the nitrogen gas does not flow to the oxidation space SO from the second inert gas piping 35. FIG. 4A shows an example where the nitrogen gas inside the second inert gas piping 35 is supplied to the oxidation space SO via the vapor supply port 31. The nitrogen gas inside the second inert gas piping 35 may instead be supplied to the oxidation space SO via a supply port that is separate from the ozone gas supply port 22 and the vapor supply port 31.

After the vapor of IPA is supplied to the oxidation space SO, the vapor of IPA inside the oxidation space SO is exhausted through the first exhaust port 28. Specifically, after the vapor of IPA is supplied to the oxidation space SO, the vapor valve 33 is closed and the second inert gas valve 36 is opened in a state where the first exhaust valve 30 is open. Thereby, the nitrogen gas is supplied to the oxidation space SO and the gas inside the oxidation space SO such as the vapor of IPA, etc., is exhausted to the first exhaust port 28. Consequently, the vapor of IPA inside the oxidation space SO is replaced by the nitrogen gas and the oxidation space SO is filled with the nitrogen gas.

Next, the supplying of the etching liquid shall be described.

The processing unit 2 includes the first processing tank 41 that stores, in the etching space SE, the etching liquid in which the plurality of substrates W are immersed. The first processing tank 41 corresponds to an etching processing tank that stores the etching liquid. FIG. 4A shows an example where the etching liquid is pure water (indicated as DIW in FIG. 4A). The first processing tank 41 includes an inner tank 42 that stores the etching liquid and an outer tank 43 that stores the etching liquid that overflowed from the inner tank 42. The inner tank 42 includes an outer peripheral wall of cylindrical shape and a bottom wall that closes a bottom of the outer peripheral wall. The plurality of substrates W are placed inside the inner tank 42 from an upper side of the inner tank 42 and are immersed in the etching liquid inside the inner tank 42. Thereby, the plurality of substrates W are put in contact with the etching liquid and the etching liquid is supplied to each of the substrates W.

The processing unit 2 includes a circulation system that circulates the etching liquid inside the first processing tank 41. The circulation system includes a circulation piping 44 that guides the etching liquid inside the outer tank 43 toward the inner tank 42 and return nozzles 47 by which the etching liquid supplied from the circulation piping 44 is discharged from discharge ports 47p disposed inside the inner tank 42 to supply the etching liquid into the inner tank 42. FIG. 4A shows an example where two return nozzles 47 are provided. In this example, the circulation piping 44 includes an upstream piping 44u that extends downstream from the outer tank 43 and two downstream pipings 44d that branch from the upstream piping 44u.

The circulation system further includes a circulation pump 46 that feeds the etching liquid inside the circulation piping 44 toward the inner tank 42 and a filter 45 that removes foreign matter from the etching liquid flowing through the circulation piping 44. The circulation pump 46 constantly feeds the etching liquid from an upstream end of the circulation piping 44 to a downstream end of the circulation piping 44. The etching liquid continues to overflow from the inner tank 42 to the outer tank 43 and circulates through a circulation path formed by the inner tank 42, the outer tank 43, the circulation piping 44, and the return nozzles 47. If the etching liquid inside the first processing tank 41 is to be maintained at a temperature higher or lower than room temperature, the etching liquid flowing through the circulation piping 44 may be heated or cooled by a heater or a cooler.

Next, the oxidation space SO and the etching space SE shall be described.

The processing unit 2 includes the plurality of partitions 52 forming the internal space of the processing unit 2 that includes the oxidation space SO and the etching space SE. Each partition 52 may be a single plate or a plurality of plates that are disposed on a single flat surface and are coupled to each other. The partition 52 may be of quadrilateral shape or rectangular shape or may be of a shape other than these. If the partition 52 includes a plurality of plates, all of the plates may be of the same shape or a plurality of plates differing in shape may be included in the partition 52. The same applies to size and material of each plate in the case where the partition 52 includes a plurality of plates.

The plurality of partitions 52 surround an entire circumference of the oxidation space SO and are positioned above and below the oxidation space SO. Similarly, the plurality of partitions 52 surround an entire circumference of the etching space SE and are positioned above and below the etching space SE. The oxidation space SO and the etching space SE are partitioned by a first inner partition 57 to be described below. The oxidation space SO is disposed above the etching space SE such as to overlap with the etching space SE in plan view.

As shown in FIG. 4B, the plurality of partitions 52 are disposed at inner sides of an outer wall 51 of the substrate processing apparatus 1 that forms an outer surface of the substrate processing apparatus 1. The plurality of partitions 52 include at least one fixed partition 53 that is fixed with respect to the outer wall 51 of the substrate processing apparatus 1 and a plurality of movable partitions that are movable with respect to the outer wall 51 of the substrate processing apparatus 1. The plurality of movable partitions include an outer partition 55 that forms a contour of the internal space of the processing unit 2 and the first inner partition 57 that divides the internal space of the processing unit 2.

The plurality of partitions 52 form an entrance/exit 54 through which the plurality of substrates W that enter and exit the internal space of the processing unit 2 pass. FIG. 4A and FIG. 4B show an example where the fixed partition 53 that is disposed above the oxidation space SO forms the entrance/exit 54. The entrance/exit 54 may instead be formed by the fixed partitions 53 that are positioned at the circumference of the oxidation space SO. The entrance/exit 54 may instead be formed by a fixed partition 53 other than the fixed partitions 53 that form the oxidation space SO.

The entrance/exit 54 is opened and closed by the outer partition 55 that corresponds to a shutter. An opening/closing actuator 56 moves the outer partition 55 between an open position at which the plurality of substrates W can pass through the entrance/exit 54 and a closed position at which the entrance/exit 54 is closed by the outer partition 55. The outer partition 55 may be of a slide type that moves in parallel between the open position and the closed position or may be of a rotating type that rotates between the open position and the closed position or may be of a type other than these. When the opening/closing actuator 56 moves the outer partition 55 to the closed position, the entrance/exit 54 is sealed by the outer partition 55.

The internal space of the processing unit 2 is divided into the oxidation space SO and the etching space SE by the first inner partition 57. The first inner partition 57 is disposed between the oxidation space SO and the etching space SE and partitions the two. A contour of the oxidation space SO is formed by the outer partition 55, the first inner partition 57, and the fixed partitions 53. A contour of the etching space SE is formed by the first inner partition 57 and the fixed partitions 53.

A passage switching actuator 58 moves the first inner partition 57 between an open position at which the plurality of substrates W can move between the oxidation space SO and the etching space SE and a closed position at which the movement of the substrates W between the oxidation space SO and the etching space SE is blocked by the first inner partition 57. The first inner partition 57 may be of a slide type that moves in parallel between the open position and the closed position or may be of a rotating type that rotates between the open position and the closed position or may be of a type other than these. When the passage switching actuator 58 moves the first inner partition 57 to the closed position, the oxidation space SO and the etching space SE are divided by the first inner partition 57 such that a fluid such as a liquid and gas, etc., cannot move between the oxidation space SO and the etching space SE.

Two white arrow marks in FIG. 4B express that the outer partition 55 moves in a width direction of the substrate processing apparatus 1 (right/left direction in FIG. 4B) between the open position and the closed position and the first inner partition 57 moves in the width direction of the substrate processing apparatus 1 between the open position and the closed position. The outer partition 55 may instead be movable in a direction different from the width direction of the substrate processing apparatus 1. The same applies to the first inner partition 57.

The plurality of partitions 52 house the heating lamps 21 and the first processing tank 41. The heating lamps 21 are disposed in the oxidation space SO. The first processing tank 41 is disposed in the etching space SE. In the example shown in FIG. 4A and FIG. 4B, the first inner partition 57 is disposed higher than the first processing tank 41 and the outer partition 55 is disposed higher than the first inner partition 57. When the outer partition 55 and the first inner partition 57 are disposed at the respective closed positions, the outer partition 55 overlaps with the first inner partition 57 in plan view. A distance in a vertical direction from a surface of the etching liquid inside the inner tank 42 to a lower surface of the first inner partition 57 is less than a diameter of each substrate W. This distance may be not less than the diameter of the substrate W instead.

The oxidation space SO and the etching space SE are spaces formed in an interior of the substrate processing apparatus 1. When the outer partition 55 and the first inner partition 57 are disposed at the respective closed positions, the oxidation space SO is sealed. That is, with the exception of passage through a specific location such as the ozone gas supply port 22, the vapor supply port 31, the first exhaust port 28, etc., a fluid cannot enter or exit the oxidation space SO. When the first inner partition 57 is disposed at the closed position, the etching space SE may be a sealed space like the oxidation space SO or may be an open space that a fluid can enter or exit freely.

The auxiliary transfer robot 12 performs carry-in and carry-out of the plurality of substrates W with respect to the internal space of the processing unit 2. Further, the plurality of substrates W are moved in the internal space of the processing unit 2 and stopped at an arbitrary position in the internal space of the processing unit 2 by the auxiliary transfer robot 12. In the example shown in FIG. 4A and FIG. 4B, the auxiliary transfer robot 12 moves the plurality of substrates W between the oxidation space SO and the etching space SE and stops the plurality of substrates W in each of the oxidation space SO and the etching space SE.

As described above, the auxiliary transfer robot 12 includes the plurality of support bars 14, the base plate and the upper plate 16. The plurality of support bars 14 are disposed, in the state of supporting the plurality of substrates W, in the internal space of the processing unit 2 that includes the oxidation space SO and the etching space SE. In this state, the base plate 15 is also disposed in the internal space of the processing unit 2. The upper plate 16 is inserted in a guide groove 59 that penetrates through at least one of the partitions 52. Therefore, at least a portion of the upper plate 16 is disposed in the internal space of the processing unit 2 and a remaining portion of the upper plate 16 is disposed outside the internal space of the processing unit 2.

The guide groove 59 is opened at an inner surface and an outer surface of at least one of the partitions 52. The guide groove 59 connects a space at an outer side of the plurality of partitions 52 and the internal space of the processing unit 2. The upper plate 16 moves together with the plurality of support bars 14 and the base plate 15 while in the state of being inserted in the guide groove 59. When a portion of the upper plate 16 is stopped inside the guide groove 59 and when it is moving inside the guide groove 59, gaps between surfaces of the upper plate 16 and inner surfaces of the guide groove 59 are sealed by a seal. A state where the upper plate 16 and the guide groove 59 are sealed is thereby maintained.

Next, an example of processing of the substrates W shall be described.

FIG. 5 is a process chart for describing the example of processing of the substrates W according to the first preferred embodiment of the present invention. FIG. 6A, FIG. 6B, FIG. 6C, FIG. 6D, FIG. 6E, FIG. 6F, and FIG. 6G are schematic sectional views showing states of the processing unit 2 when the example of processing of the substrates W shown in FIG. 5 is being performed. In the following, FIG. 4A, FIG. 4B, and FIG. 5 shall be referenced. FIG. 6A to FIG. 6G shall be referenced as appropriate.

When processing the substrate W by the processing unit 2, the main transfer robot 11 (see FIG. 2) transfers the plurality of substrates W that constitute a single batch to the auxiliary transfer robot 12. Thereafter, the opening/closing actuator 56 moves the outer partition 55, corresponding to the shutter of the processing unit 2, from the closed position to the open position and opens the entrance/exit 54 of the processing unit 2. Thereafter, as shown in FIG. 6A, the auxiliary transfer robot 12 moves the plurality of support bars 14 into the processing unit 2 through the entrance/exit 54 while supporting the substrates W of one batch with the plurality of support bars 14. The plurality of substrates W are thereby carried into the processing unit 2 (step S1 of FIG. 5).

After the plurality of substrates W have been carried in, the opening/closing actuator 56 moves the outer partition 55 from the open position to the closed position in the state where the first inner partition 57 is disposed at the closed position. The oxidation space SO is thereby sealed. Thereafter, the oxidation space SO is filled with the ozone gas. The heating lamps 21 are made to start emitting light before filling or after filling the oxidation space SO with the ozone gas. Thereafter, as shown in FIG. 6B, the oxidation step is performed continuously for not less than the maximum growth time described above while maintaining fixed the conditions such as the temperature of the substrates W, the concentration of the ozone gas in the atmosphere in contact with the substrates W, etc. (step S2 of FIG. 5).

When the oxidation step is performed, oxygen atoms in the atmosphere in contact with the substrates W bond with the molybdenum inside the molybdenum films 100 (see FIG. 1B) and the molybdenum changes to molybdenum trioxide. The molybdenum oxide films 105 (see FIG. 1B) that contain the molybdenum trioxide are thereby formed on the front surfaces 103 of the molybdenum films 100. Further, if the oxidation step is performed continuously for not less than the maximum growth time while maintaining the oxidation conditions fixed, the thickness of each molybdenum oxide film 105 increases to the maximum thickness and stays at the maximum thickness due to the self-limitation described above.

After the oxidation step has been performed continuously for not less than the maximum growth time, the heating lamps 21 are made to stop emitting light. Before or after the heating lamps 21 stop emitting light, the gas inside the oxidation space SO such as the ozone gas, etc., is exhausted through the first exhaust port 28 and the oxidation space SO is filled with a gas other than ozone gas such as the inert gas, etc. After the heating lamps 21 have stopped emitting light and the ozone gas inside the oxidation space SO has been exhausted, the passage switching actuator 58 moves the first inner partition 57 from the closed position to the open position. The processing unit 2 is thereby switched from a movement disabled state in which the plurality of substrates W cannot move between the oxidation space SO and the etching space SE to a movement enabled state in which the plurality of substrates W can move between the oxidation space SO and the etching space SE.

After the first inner partition 57 has moved to the open position, the auxiliary transfer robot 12 moves the plurality of support bars 14 to move the plurality of substrates W toward the etching space SE until an entirety of the plurality of substrates W supported by the plurality of support bars 14 is immersed in the etching liquid inside the first processing tank 41 as shown in FIG. 6C (step S3 of FIG. 5). Thereby, the plurality of substrates W supported by the plurality of support bars 14 move to the etching space SE and the etching liquid is supplied to entire regions of outer surfaces of the respective substrates W. After the plurality of substrates W have moved to the etching space SE, the passage switching actuator 58 may move the first inner partition 57 to the closed position or may stop it at the open position. FIG. 6D shows an example of the former.

As shown in FIG. 6D, the auxiliary transfer robot 12 maintains the state in which the entirety of the plurality of substrates W supported by the plurality of support bars 14 is immersed in the etching liquid inside the first processing tank 41 for not less than the etching end time described above. Thereby, all or nearly all of the molybdenum oxide films 105 are removed from the substrates W and remaining portions of the molybdenum films 100 that did not change to the molybdenum trioxide remain on the substrates W (step S4 of FIG. 5). That is, by a portion of each molybdenum film 100 changing to the molybdenum trioxide, the thickness of the molybdenum film 100 is decreased than before performing the oxidation step and the molybdenum oxide film 105 formed by oxidation of the molybdenum film 100 is removed from the molybdenum film 100 by the supplying of the etching liquid.

Figure 6E:
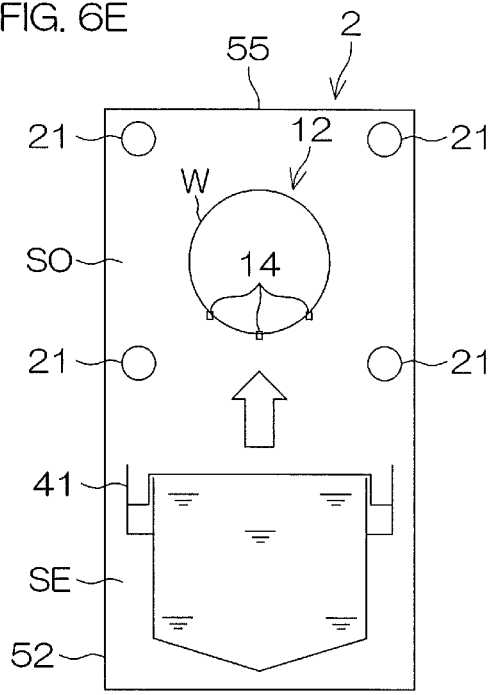
FIG. 6E to G are schematic sectional views showing states of the processing unit when the example of processing of the substrates shown in FIG. 5 is being performed.

After the etching liquid has been supplied to the plurality of substrates W for not less than the etching end time, the auxiliary transfer robot 12 moves the plurality of support bars 14 to move the plurality of substrates W supported by the plurality of support bars 14 from the etching space SE to the oxidation space SO as shown in FIG. 6E (step S5 of FIG. 5). If the first inner partition 57 is disposed at the closed position, the first inner partition 57 is moved to the open position before the plurality of substrates W are moved from the etching space SE and after the plurality of substrates W have been moved to the oxidation space SO, the first inner partition 57 is moved to the closed position.

After the plurality of substrates W have moved to the oxidation space SO, the oxidation step of heating the plurality of substrates W inside the oxidation space SO while supplying the ozone gas to the plurality of substrates W inside the oxidation space SO is performed in the same manner as described above (step S6 of FIG. 5). After the oxidation step of the second time has been performed, the etching step of immersing the plurality of substrates W in the etching liquid inside the etching space SE is performed in the same manner as described above (step S6 of FIG. 5). If necessary, the oxidation step and the etching step of a third time may be performed and the oxidation step and the etching step of a fourth time or more may be performed. The "N" in FIG. 5 is a positive integer.

After the etching step has been performed, the drying step of drying the substrate W simply or completely may be performed before performing the oxidation step. That is, the oxidation space SO may be filled with the vapor of IPA supplied from the vapor supply port 31 or a gas such as the inert gas, etc., may be blown onto the plurality of substrates W. When the auxiliary transfer robot 12 moves the plurality of substrates W out of the first processing tank 41, a large portion of the etching liquid flows down from the substrates W. Therefore, if a minute amount of the etching liquid that remains on the substrates W practically does not have an influence on the oxidation step, the oxidation step may be performed without drying the substrates W.

Figure 6F:
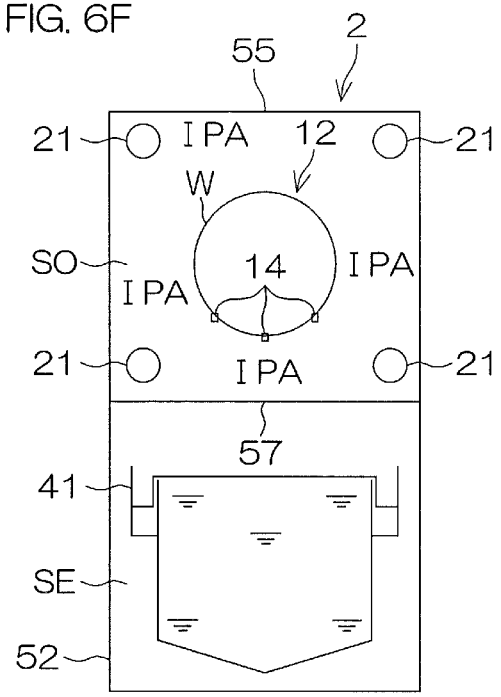

After the last etching step has been performed, the auxiliary transfer robot 12 moves the plurality of support bars 14 to move the plurality of substrates W from the etching space SE to the oxidation space SO and the passage switching actuator 58 moves the first inner partition 57 to the closed position. Thereafter, as shown in FIG. 6F, the drying step of filling the oxidation space SO with the vapor of IPA is performed (step S7 of FIG. 5). The liquid adhered to the substrates W is thereby removed and the plurality of substrates W supported by the plurality of support bars 14 dry inside the oxidation space SO serving in common as the drying space. Thereafter, the vapor of IPA is exhausted from the oxidation space SO through the first exhaust port 28 and the oxidation space SO is filled with a gas such as the inert gas, etc.

Figure 6G:
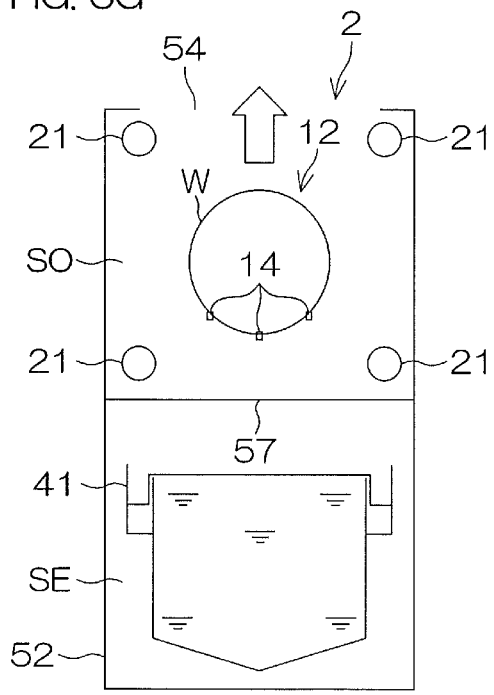

After the plurality of substrates W inside the oxidation space SO have dried, the opening/closing actuator 56 moves the outer partition 55 from the closed position to the open position and the auxiliary transfer robot 12 moves the plurality of support bars 14 to move the plurality of substrates W out of the processing unit 2 through the entrance/exit 54 as shown in FIG. 6G (step S8 of FIG. 5). Thereafter, the auxiliary transfer robot 12 transfers the plurality of substrates W to the main transfer robot 11 (see FIG. 2). The plurality of substrates W transferred to the main transfer robot 11 are housed in the carrier CA on the load port LP (see FIG. 2). The plurality of substrates W that are unprocessed are thus carried into the processing unit 2 and the plurality of substrates W that have been processed are carried out from the processing unit 2.

As described above, with the present preferred embodiment, the plurality of substrates W are heated while supplying the oxygen gas or the ozone gas to the plurality of substrates W in the state where the plurality of substrates W are disposed in the oxidation space SO inside the substrate processing apparatus 1. Thereby, the oxygen atoms contained in the oxygen gas or the ozone gas bond with the molybdenum and the surface layers 102 of the molybdenum films 100 change to the molybdenum trioxide. Thereafter, the plurality of substrates W are transferred from the oxidation space SO inside the substrate processing apparatus 1 to the etching space SE inside the substrate processing apparatus 1 and the etching liquid is supplied to the plurality of substrates W inside the etching space SE. The molybdenum trioxide dissolves in the etching liquid. Therefore, the surface layers 102 of the molybdenum films 100 that have changed to the molybdenum trioxide are etched while the portions other than the surface layers 102 of the molybdenum films 100 that have not changed to the molybdenum trioxide remain on the substrates W.

Thus, it is possible to oxidize the molybdenum films 100 formed on the substrates W by heating the substrates W while supplying the oxygen gas or the ozone gas to the substrates Further, since the oxidation and the etching of the molybdenum films 100 are performed inside the single substrate processing apparatus 1, a time required to transfer the substrates W can be shortened in comparison to a case where the oxidation of the molybdenum films 100 and the etching of the molybdenum oxide films 105 are performed in separate substrate processing apparatuses. In addition, since the plurality of substrates W are oxidized in a batch and etched in a batch, a time required for oxidation and etching can be shortened in comparison to a case where the plurality of substrates W are oxidized one by one and etched one by one.

With the present preferred embodiment, the substrates W are heated while supplying not the oxygen gas but the ozone gas to the substrates W. Therefore, in comparison to a case of heating the substrates W while supplying the oxygen gas to the substrates W, the surface layers 102 of the molybdenum films 100 can be changed to the molybdenum trioxide efficiently. Thereby, a time for changing the surface layers 102 of the molybdenum films 100 to the molybdenum trioxide can be shortened and a throughput (number of substrates W processed per unit time) of the substrate processing apparatus 1 can be increased.

With the present preferred embodiment, a water-containing liquid having water as the main component is supplied to the substrates W to etch the substrates W. Whereas the molybdenum trioxide dissolves in water, the molybdenum does not dissolve or hardly dissolves in water. The surface layers 102 of the molybdenum films 100 that have changed to the molybdenum trioxide can therefore be removed from the substrates W without using a chemical liquid. Thereby, treatment of waste liquid can be simplified and a load on the environment can be lightened in comparison to a case where the etching liquid is a chemical liquid.

With the present preferred embodiment, after the etching liquid has been supplied to the plurality of substrates W inside the etching space SE, the plurality of substrates W are transferred to the oxidation space SO and the plurality of molybdenum films 100 formed on the plurality of substrates W are oxidized. That is, the oxidation of the molybdenum films 100 and the etching of the molybdenum oxide films 105 are repeated alternately a plurality of times. Thereby, the thicknesses of the molybdenum films 100 can be decreased in steps and the thicknesses of the molybdenum films 100 can be adjusted in steps.

With the present preferred embodiment, the plurality of molybdenum films 100 are oxidized, the plurality of substrates W are transferred from the oxidation space SO to the etching space SE, and the plurality of molybdenum oxide films 105 are etched in the state where the plurality of substrates W are held by the support frame 13 that is an example of the substrate holder. That is, in order to perform the oxidation of the molybdenum films 100, the transfer of the substrates W from the oxidation space SO to the etching space SE, and the etching of the molybdenum oxide films 105, there is no need to move the plurality of substrates W held by the substrate holder to another substrate holder and there is no need to provide a plurality of substrate holders. The throughput of the substrate processing apparatus 1 can thereby be increased.

With the present preferred embodiment, the first inner partition 57 is disposed between the oxidation space SO and the etching space SE and forms a portion of the contour of the oxidation space SO and a portion of the contour of the etching space SE. At least a portion of the oxidation space SO is partitioned off from the etching space SE by just the first inner partition 57. When the first inner partition 57 is moved, it becomes possible to move the plurality of substrates W between the oxidation space SO and the etching space SE. Since the oxidation space SO is disposed close to the etching space SE across just the first inner partition 57, a time for transferring the substrates W to the etching space SE can be shortened and the throughput of the substrate processing apparatus 1 can be increased.

With the present preferred embodiment, after supplying the etching liquid to the plurality of substrates W, the plurality of substrates W are moved from the etching space SE to the oxidation space SO. Thereafter, the plurality of substrates W inside the oxidation space SO are dried. That is, the oxidation space SO serves in common as the drying space in which the substrates W are dried and the oxidation and the drying of the molybdenum films 100 are performed on the substrates W inside the oxidation space SO. The substrate processing apparatus 1 can thus be made compact in comparison to a case where a drying space separate from the oxidation space SO is provided.

Next, a second preferred embodiment shall be described.

In the following, arrangements in FIG. 7 to FIG. 8C that are equivalent to arrangements shown in FIG. 1A to FIG. 6G described above shall be provided with the same reference signs as in FIG. 1A, etc., and description thereof shall be omitted.

A main point of difference of the second preferred embodiment with respect to the first preferred embodiment is that whereas in the first preferred embodiment, the oxidation space SO serves in common as the drying space, in the second preferred embodiment, a drying space SD is a space that is separate from the oxidation space SO.

Figure 7:
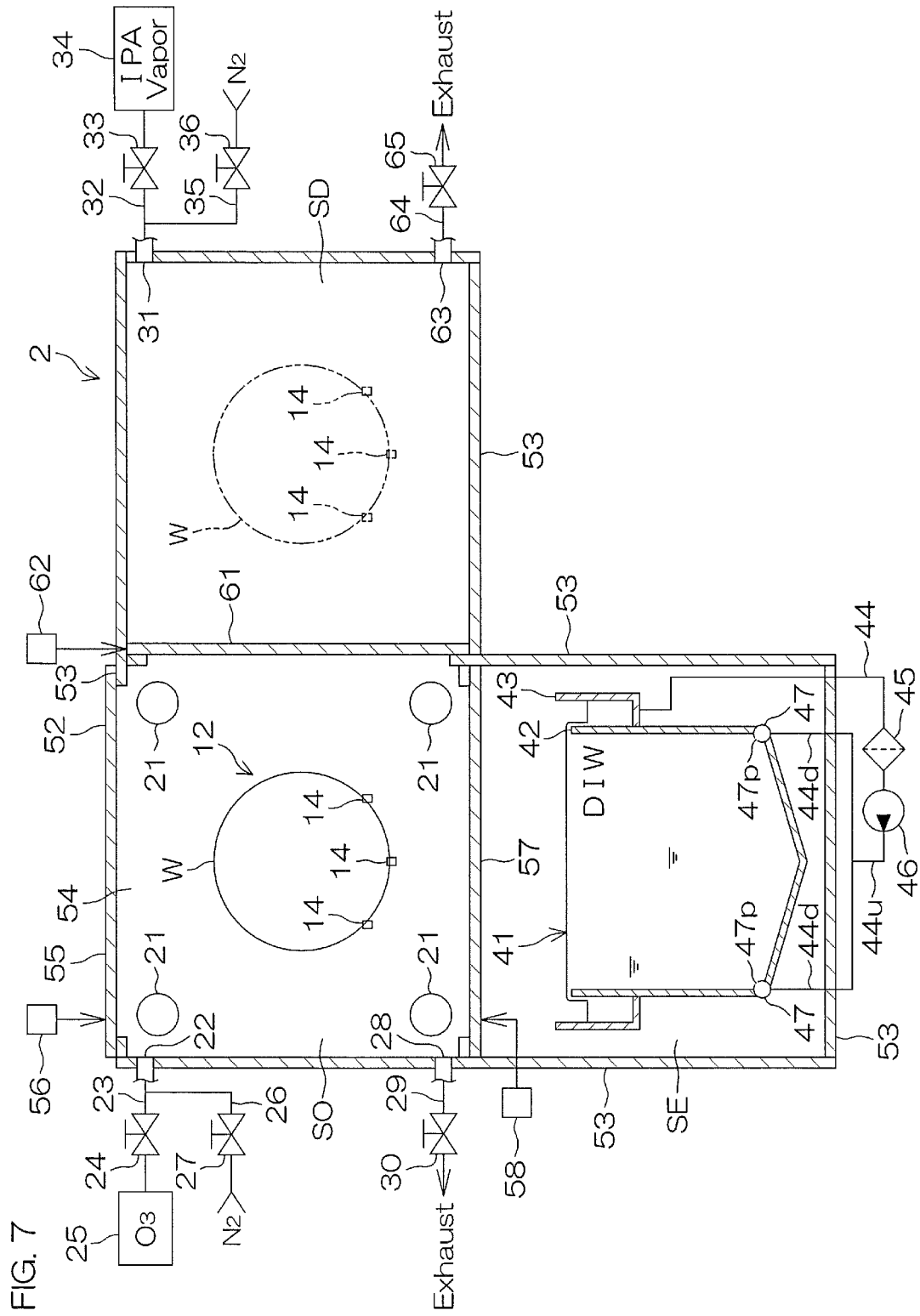
FIG. 7 is a schematic sectional view showing a vertical section of a processing unit according to a second preferred embodiment of the present invention.

FIG. 7 is a schematic sectional view showing a vertical section of the processing unit 2 according to the second preferred embodiment of the present invention. As shown in FIG. 7, the plurality of movable partitions include, in addition to the outer partition 55 and the first inner partition 57, a second inner partition 61 that is positioned between the oxidation space SO and the drying space SD. A contour of the drying space SD is formed by the second inner partition 61 and at least one fixed partition 53.

FIG. 7 shows an example where the drying space SD is disposed at a side of the oxidation space SO. The drying space SD may instead be disposed above the oxidation space SO such that the drying space SD overlaps with the oxidation space SO in plan view. In this case, the entrance/exit 54 should be formed in a fixed partition 53 that forms the drying space SD. The drying space SD may also be disposed between the oxidation space SO and the etching space SE. In this case, the drying space SD and the etching space SE should be partitioned by the first inner partition 57.

FIG. 7 shows an example where the entrance/exit 54 that is formed in the partition 52 that demarcates the oxidation space SO is opened and closed by the outer partition 55. The entrance/exit 54 may also be formed in the partition 52 that demarcates the drying space SD and this entrance/exit 54 may be opened and closed by the outer partition 55. In this case, the entrance/exit 54 may be formed just in the partition 52 that demarcates the drying space SD or one entrance/exit 54 may be formed in each of the partition 52 that demarcates the drying space SD and the partition 52 that demarcates the oxidation space SO. That is, two entrance/exits 54 may be provided in the single processing unit 2. In this case, one entrance/exit 54 may be for entrance only and the other entrance/exit 54 may be for exit only.

A passage switching actuator 62 moves the second inner partition 61 between an open position at which the plurality of substrates W can move between the oxidation space SO and the drying space SD and a closed position at which the movement of the substrates W between the oxidation space SO and the drying space SD is blocked by the second inner partition 61. The second inner partition 61 may be of a slide type that moves in parallel between the open position and the closed position or may be of a rotating type that rotates between the open position and the closed position or may be of a type other than these.

When the passage switching actuator 62 moves the second inner partition 61 to the closed position, the oxidation space SO and the drying space SD are divided by the second inner partition 61 such that a fluid such as a liquid and gas, etc., cannot move between the oxidation space SO and the drying space SD. The vapor of IPA that flows out from the vapor supply port 31 is supplied not to the oxidation space SO but to the drying space SD. When the second inner partition 61 is disposed at the closed position, the drying space SD is sealed and with the exception of passage through a specific location such as the vapor supply port 31, etc., a fluid cannot enter or exit the drying space SD.

The processing unit 2 includes, in addition to the first exhaust port 28 that exhausts the gas inside the oxidation space SO, a second exhaust port 63 that exhausts a gas inside the drying space SD. The processing unit 2 further includes a second exhaust piping 64 that guides the gas, which flowed into the second exhaust port 63, in a direction away from the drying space SD and a second exhaust valve 65 that opens and closes between an open state in which the gas inside the drying space SD flows into the second exhaust port 63 and a closed state in which the gas inside the drying space SD does not flow into the second exhaust port 63. By supplying the vapor of IPA from the vapor supply port 31 to the drying space SD and exhausting the gas inside the drying space SD to the second exhaust port 63, the drying space SD can be filled with the vapor of IPA.

Figure 8A:
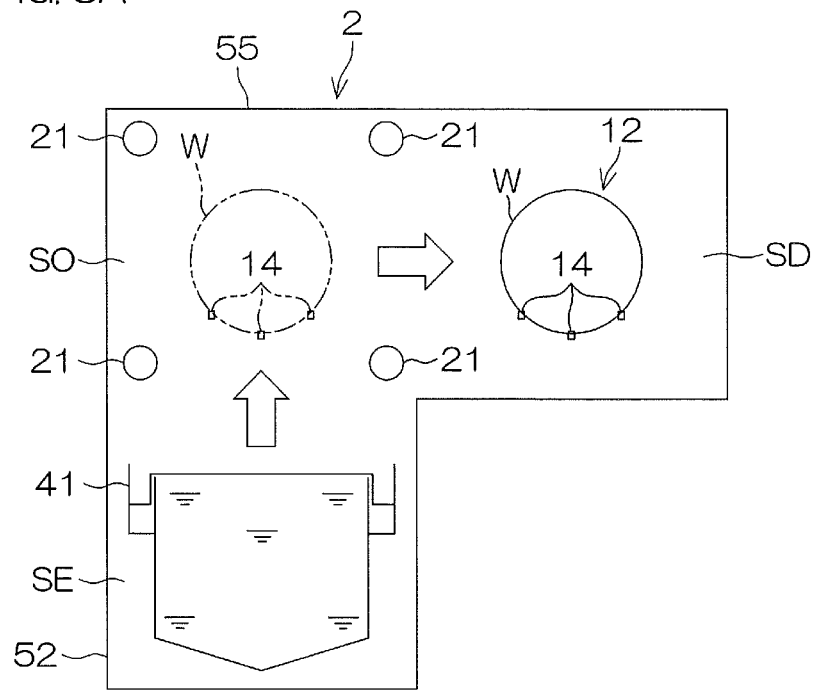
FIG. 8A is a schematic sectional view showing a state of the processing unit when an example of processing of the substrates according to the second preferred embodiment is being performed.
Figure 8B:
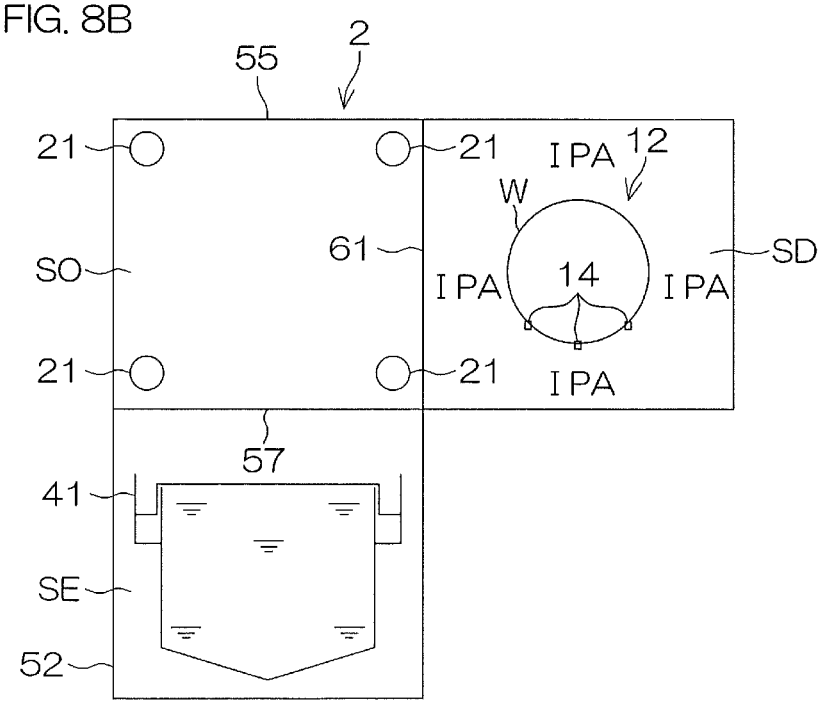
FIG. 8B is a schematic sectional view showing a state of the processing unit when the example of processing of the substrates according to the second preferred embodiment is being performed.

FIG. 8A, FIG. 8B, and FIG. 8C are schematic sectional views showing states of the processing unit 2 when an example of processing of the substrates W according to the second preferred embodiment is being performed. In the following, FIG. 7 shall be referenced. FIG. 8A to FIG. 8C shall be referenced as appropriate.

As with the processing unit 2 according to the first preferred embodiment, when the plurality of substrates W are processed by the processing unit 2 according to the second preferred embodiment, the plurality of substrates W are moved between the oxidation space SO and the etching space SE to perform a single cycle, including the oxidation step and the etching step, a plurality of times.

After the last etching step has been performed, the passage switching actuator 62 moves the second inner partition 61 from the closed position to the open position to switch the processing unit 2 from a movement disabled state in which the plurality of substrates W cannot move between the oxidation space SO and the drying space SD to a movement enabled state in which the plurality of substrates W can move between the oxidation space SO and the drying space SD. In this state, the auxiliary transfer robot 12 moves the plurality of support bars 14 to move the plurality of substrates W from the etching space SE to the drying space SD via the oxidation space SO as shown in FIG. 8A.

After the plurality of substrates W have moved from the oxidation space SO to the drying space SD, the passage switching actuator 62 move the second inner partition 61 from the open position to the closed position. Thereafter, as shown in FIG. 8B, the drying step of filling the drying space SD with the vapor of IPA supplied from the vapor supply port 31 is performed. The liquid adhered to the substrates W is thereby removed and the plurality of substrates W supported by the plurality of support bars 14 dry inside the drying space SD. Thereafter, the vapor of IPA is exhausted from the drying space SD through the second exhaust port 63 and the drying space SD is filled with a gas such as the inert gas, etc.

After the plurality of substrates W inside the drying space SD have dried, the passage switching actuator 62 moves the second inner partition 61 from the closed position to the open position and, as shown in FIG. 8C, the auxiliary transfer robot 12 moves the plurality of substrates W from the drying space SD to the oxidation space SO. Thereafter, the opening/closing actuator 56 moves the outer partition 55 from the closed position to the open position and, as shown in FIG. 8C, the auxiliary transfer robot 12 moves the plurality of substrates W out of the processing unit 2 through the entrance/exit 54.

With the second preferred embodiment, the following effects can be exhibited in addition to the effects according to the first preferred embodiment. Specifically, with the second preferred embodiment, the second inner partition 61 is disposed between the oxidation space SO or the etching space SE and the drying space SD. At least a portion of the drying space SD is partitioned off from the oxidation space SO or the etching space SE by just the second inner partition 61. When the second inner partition 61 is moved, the plurality of substrates W can enter into the drying space SD and can exit from the drying space SD. Since the drying space SD is disposed close to the oxidation space SO or the etching space SE across just the second inner partition 61, a time for transferring the substrates W to the drying space SD can be shortened and the throughput of the substrate processing apparatus 1 can be increased. In addition, the structure of the substrate processing apparatus 1 can be simplified in comparison to a case where the oxidation space SO or the etching space SE serves in common as the drying space SD.

Next, a third preferred embodiment shall be described.

In the following, arrangements in FIG. 9 to FIG. 10D that are equivalent to arrangements shown in FIG. 1A to FIG. 8C described above shall be provided with the same reference signs as in FIG. 1A, etc., and description thereof shall be omitted.

A main point of difference of the third preferred embodiment with respect to the second preferred embodiment is that a second processing tank 66 (see FIG. 9) that stores a rinse liquid in which the plurality of substrates W are immersed is disposed in the drying space SD and the drying space SD serves in common as a rinsing space in which the rinse liquid is supplied to the plurality of substrates W.

Figure 9:
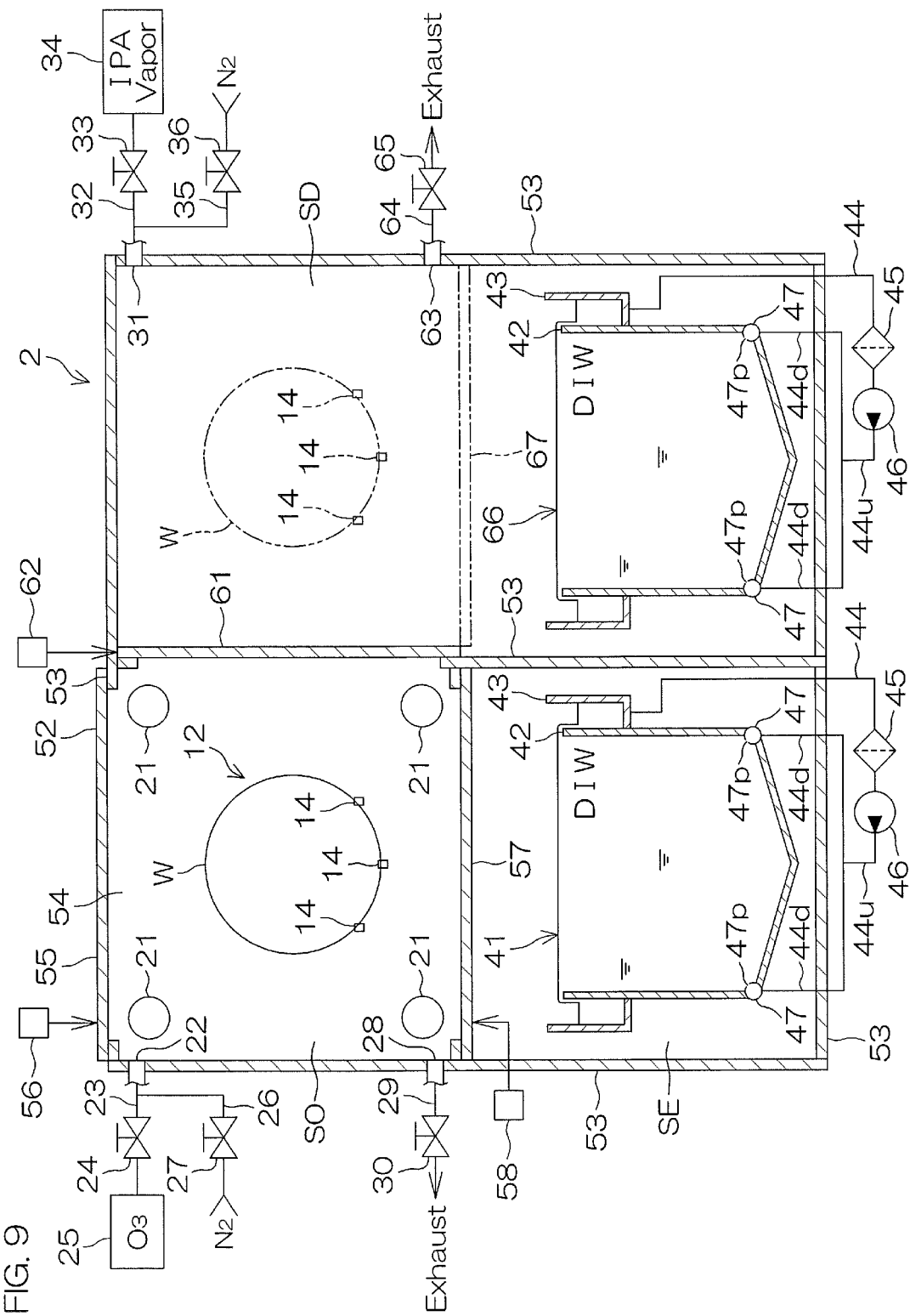
FIG. 9 is a schematic sectional view showing a vertical section of a processing unit according to a third preferred embodiment of the present invention.

FIG. 9 is a schematic sectional view showing a vertical section of the processing unit 2 according to the third preferred embodiment of the present invention. As shown in FIG. 9, the second processing tank 66 includes an inner tank 42 that stores the rinse liquid and an outer tank 43 that stores the rinse liquid that overflowed from the inner tank 42. The second processing tank 66 corresponds to a rinse processing tank that stores the rinse liquid. A distance in the vertical direction from a surface of the rinse liquid inside the inner tank 42 to an upper end of the drying space SD is greater than the diameter of each substrate W. The rinse liquid inside the outer tank 43 is fed by a circulation pump 46 to a circulation piping 44 and supplied to return nozzles 47 via a filter 45. The return nozzles 47 discharge the rinse liquid from discharge ports 47*p* disposed inside the inner tank 42 to supply the rinse liquid, supplied from the circulation piping 44, into the inner tank 42.

FIG. 9 shows an example where the etching liquid inside the first processing tank 41 and the rinse liquid inside the second processing tank 66 are both pure water (indicated as DIW in FIG. 9). The rinse liquid is not restricted to pure water and may be any of IPA (isopropyl alcohol), carbonated water, electrolyzed ion water, hydrogen water, ozone water, an aqueous hydrochloric acid solution of dilute concentration (for example, approximately 10 ppm to 100 ppm), and an ammonium hydroxide of dilute concentration (for example, approximately 10 ppm to 100 ppm). The rinse liquid may be a liquid of different type from the etching liquid.

The drying space SD is vertically longer than the oxidation space SO. The drying space SD is vertically longer than the etching space SE. The drying space SD is a rinsing/drying space that serves in common as the rinsing space. The plurality of movable partitions may include a third inner partition 67 that partitions the rinsing/drying space into a rinsing space and the drying space SD. The rinsing space is a space at a lower side of the third inner partition 67 and the drying space SD is a space at an upper side of the third inner partition 67. The rinse liquid inside the second processing tank 66 is supplied to the plurality of substrates W inside the rinsing space. The vapor of IPA that flows out from the vapor supply port 31 is supplied to the plurality of substrates W inside the drying space SD.

FIG. 10A, FIG. 10B, FIG. 10C, and FIG. 10D are schematic sectional views showing states of the processing unit 2 when an example of processing of the substrates W according to the third preferred embodiment is being performed. In the following, FIG. 9 shall be referenced. FIG. 10A to FIG. 10D shall be referenced as appropriate.

As with the processing unit 2 according to the first preferred embodiment, when the plurality of substrates W are processed by the processing unit 2 according to the third preferred embodiment, the plurality of substrates W are moved between the oxidation space SO and the etching space SE to perform a single cycle, including the oxidation step and the etching step, a plurality of times.

Figure 10A:
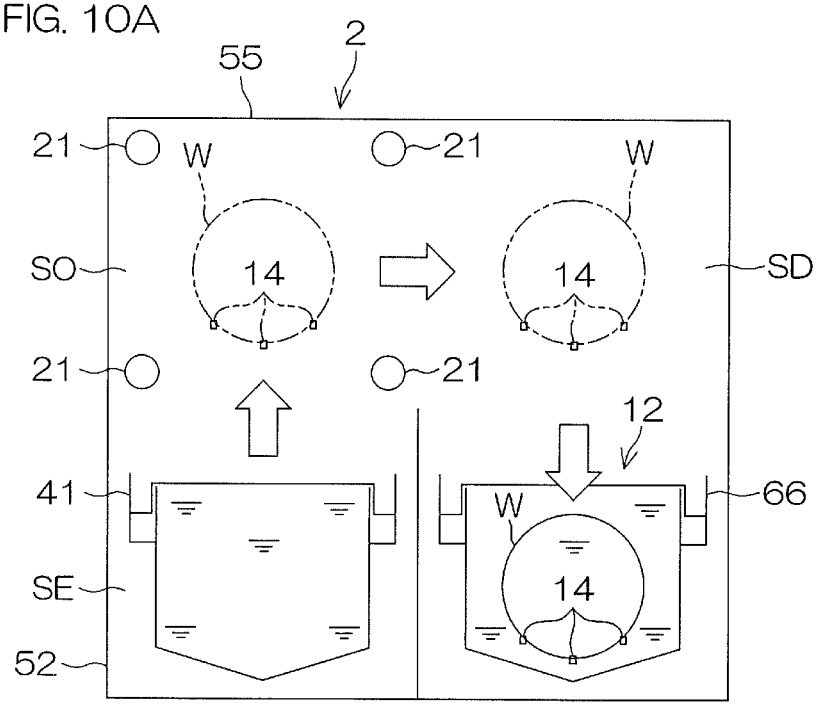
FIG. 10A is a schematic sectional view showing a state of the processing unit when an example of processing of the substrates according to the third preferred embodiment is being performed.

After the last etching step has been performed, the passage switching actuator 62 moves the second inner partition 61 from the closed position to the open position to switch the processing unit 2 from the movement disabled state in which the plurality of substrates W cannot move between the oxidation space SO and the drying space SD to the movement enabled state in which the plurality of substrates W can move between the oxidation space SO and the drying space SD. In this state, the auxiliary transfer robot 12 moves the plurality of support bars 14 to move the plurality of substrates W from the oxidation space SO to the drying space SD as shown in FIG. 10A. Thereafter, the passage switching actuator 62 moves the second inner partition 61 from the open position to the closed position.

After the plurality of substrates W have moved to the drying space SD that serves in common as the rinsing space, the auxiliary transfer robot 12 moves the plurality of support bars 14 to move the plurality of substrates W inside the drying space SD until the entirety of the plurality of substrates W supported by the plurality of support bars 14 is immersed in the rinse liquid inside the second processing tank 66 as shown in FIG. 10A. Thereby, a final rinsing step of using the rinse liquid to rinse off the etching liquid and particles, etc., that are adhered to the substrates W is performed immediately before drying the substrates W.

Figure 10B:
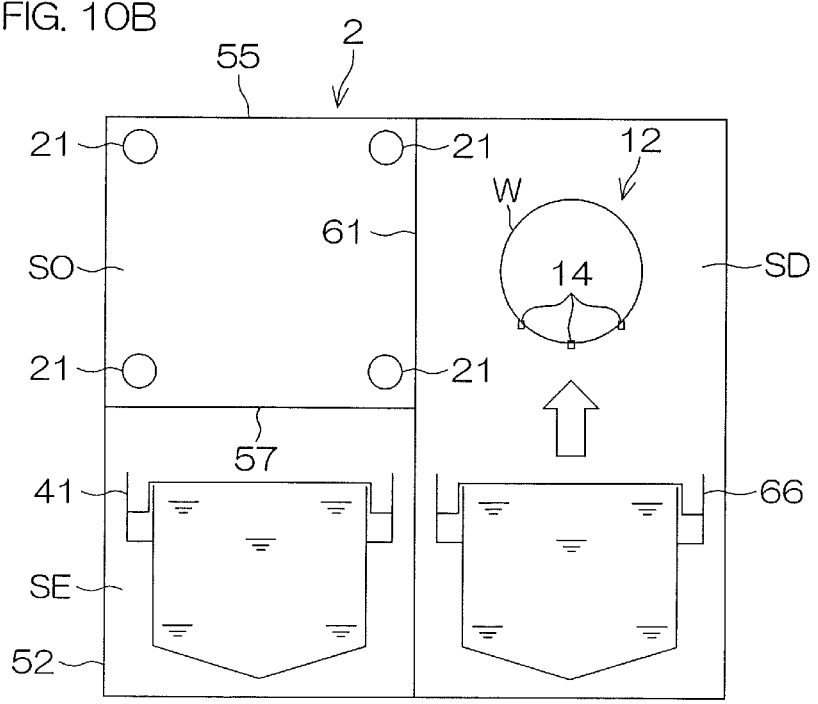
FIG. 10B is a schematic sectional view showing a state of the processing unit when the example of processing of the substrates according to the third preferred embodiment is being performed.
Figure 10C:
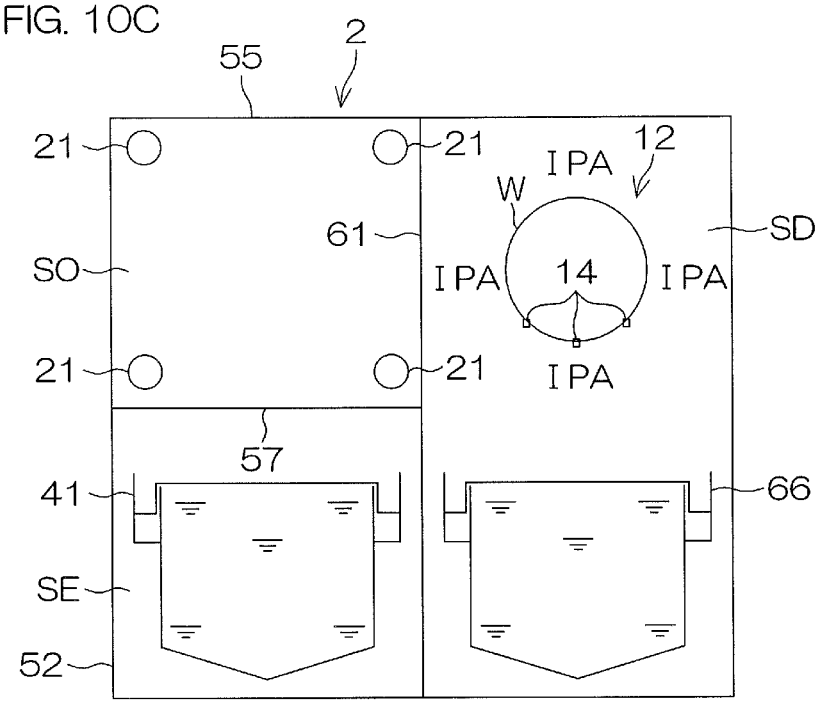
FIG. 10C is a schematic sectional view showing a state of the processing unit when the example of processing of the substrates according to the third preferred embodiment is being performed.

After the rinsing liquid has been supplied to the plurality of substrates W, the auxiliary transfer robot 12 moves the plurality of support bars 14 to move the plurality of substrates W inside the drying space SD until the entirety of the plurality of substrates W supported by the plurality of support bars 14 moves out of the second processing tank 66 as shown in FIG. 10B. Thereafter, as shown in FIG. 10C, the drying step of filling the drying space SD with the vapor of IPA supplied from the vapor supply port 31 is performed. The liquid adhered to the substrates W is thereby removed and the plurality of substrates W supported by the plurality of support bars 14 dry inside the drying space SD. Thereafter, the vapor of IPA is exhausted from the drying space SD through the second exhaust port 63 and the drying space SD is filled with a gas such as the inert gas, etc.

Figure 10D:
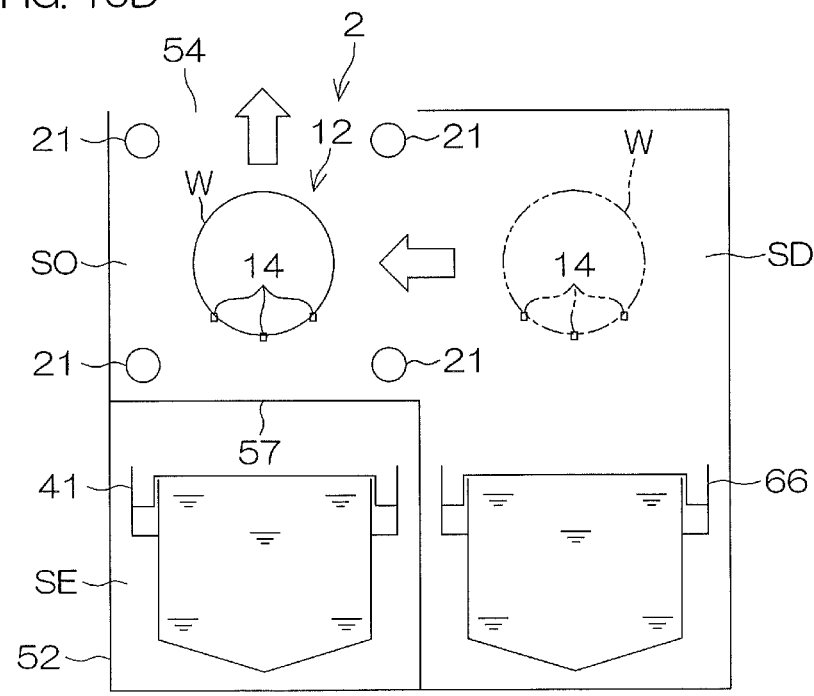
FIG. 10D is a schematic sectional view showing a state of the processing unit when the example of processing of the substrates according to the third preferred embodiment is being performed.

After the plurality of substrates W inside the drying space SD have dried, the passage switching actuator 62 moves the second inner partition 61 from the closed position to the open position and, as shown in FIG. 10D, the auxiliary transfer robot 12 moves the plurality of substrates W from the drying space SD to the oxidation space SO. Thereafter, the opening/closing actuator 56 moves the outer partition 55 from the closed position to the open position and, as shown in FIG. 10D, the auxiliary transfer robot 12 moves the plurality of substrates W out of the processing unit 2 through the entrance/exit 54.

With the third preferred embodiment, the following effects can be exhibited in addition to the effects according to the first preferred embodiment. Specifically, with the third preferred embodiment, after supplying the etching liquid to the plurality of substrates W, the rinse liquid is supplied to the plurality of substrates W. The etching liquid and particles adhered to the substrates W can thereby be rinsed off with the rinse liquid. If the etching liquid and the rinse liquid are liquids of different types, a piping, etc., for the etching liquid and a piping, etc., for the rinse liquid must be provided. If both are liquids of the same name, separate pipings, etc., do not have to be provided and the structure of the substrate processing apparatus 1 can be simplified.

Other Preferred Embodiments

The substrates W may be cooled before immersing the substrates W in the etching liquid inside the first processing tank 41. For example, a cooling gas such as the inert gas, air, etc., may be supplied to the substrates W inside the oxidation space SO until the temperature of the substrate W drops to room temperature or a vicinity thereof. In this case, a temperature of the cooling gas may be room temperature or less than room temperature.

If, before drying the substrates W to which the etching liquid has been supplied, the rinsing liquid is to be supplied to the substrates W, instead of immersing the plurality of substrates W in the rinse liquid inside the second processing tank 66, the etching liquid inside the first processing tank 41 may be replaced by the rinse liquid in the state where the plurality of substrates W are disposed inside the first processing tank 41 to supply the rinse liquid to the plurality of substrates W inside the first processing tank 41.

When drying the substrates W, in addition to or in place of supplying the vapor of IPA or other organic solvent to the substrates W, a gas pressure inside the drying space SD (in the case of the first preferred embodiment, the oxidation space SO that serves in common as the drying space) may be decreased to promote evaporation of the liquid adhered to the substrates W.

Instead of performing three steps, that is, the oxidation of the molybdenum films 100, the transfer of the substrates W inside the processing unit 2, and the etching of the molybdenum oxide films 105 in the state where the plurality of substrates W are held by the support frame 13 of the auxiliary transfer robot 12, at least one of the three steps may be performed in the state where the plurality of substrates W are held by a substrate holder other than the support frame 13.

If the amount by which the thickness of each molybdenum film 100 is to be decreased is small, the number of times of performing the oxidation step and the etching step on a single substrate W may be once.

The substrate processing apparatus 1 is not restricted to an apparatus to process a disc-shaped substrate W, and may be an apparatus to process a polygonal substrate W.

Two or more arrangements among all the arrangements described above may be combined. Two or more steps among all the steps described above may be combined. The support frame 13 is an example of the substrate holder. The heating lamps 21, the ozone gas supply port 22, the ozone gas piping 23, the ozone gas valve 24, and the ozone gas generator 25 are an example of an oxidizing unit. The first processing tank 41, the inner tank 42, the outer tank 43, the circulation piping 44, the downstream pipings 44d, the upstream piping 44u, the filter the circulation pump 46, the return nozzles 47, and the discharge ports 47p are an example of an etching means.

The preferred embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

What is claimed is:

1. A substrate processing method comprising:
   heating a plurality of substrates disposed in an oxidation space inside a substrate processing apparatus while supplying an oxygen gas or an ozone gas to the plurality of substrates inside the oxidation space to change, in each of the plurality of substrates, a surface layer of a molybdenum film formed on the substrate to molybdenum trioxide without changing a portion other than the surface layer of the molybdenum film to the molybdenum trioxide;
   transferring the plurality of substrates inside the oxidation space to an etching space inside the substrate processing apparatus differing from the oxidation space; and
   supplying an etching liquid to the plurality of substrates inside the etching space to make, in each of the plurality of substrates, the surface layer that changed to the molybdenum trioxide dissolve in the etching liquid while leaving, on the substrate, the portion other than the surface layer of the molybdenum film.

2. The substrate processing method according to claim 1, wherein when heating the plurality of substrates disposed in the oxidation space, the plurality of substrates inside the oxidation space are heated while supplying the ozone gas to the plurality of substrates inside the oxidation space.

3. The substrate processing method according to claim 1, wherein the etching liquid is a water-containing liquid having water as a main component.

4. The substrate processing method according to claim 1, further comprising:
   transferring the plurality of substrates inside the etching space to the oxidation space; and
   wherein in the substrate processing method, a single cycle that includes heating the plurality of substrates disposed in the oxidation space while supplying the oxygen gas or the ozone gas to the plurality of substrates inside the oxidation space, transferring the plurality of substrates inside the oxidation space to the etching space, supplying the etching liquid to the plurality of substrates inside the etching space, and transferring the plurality of substrates inside the etching space to the oxidation space is performed a plurality of times.

5. The substrate processing method according to claim 1, wherein when heating the plurality of substrates disposed in the oxidation space, the plurality of substrates inside the oxidation space are heated while supplying the oxygen gas or the ozone gas to the plurality of substrates inside the oxidation space in a state where the plurality of substrates are held by a substrate holder,
   when transferring the plurality of substrates inside the oxidation space to the etching space, the substrate holder is moved from the oxidation space to the etching space to transfer the plurality of substrates inside the oxidation space to the etching space, and
   when supplying the etching liquid to the plurality of substrates inside the etching space, the etching liquid is supplied to the plurality of substrates inside the etching space in the state where the plurality of substrates are held by the substrate holder.

6. The substrate processing method according to claim 1, wherein when transferring the plurality of substrates inside the oxidation space to the etching space, after moving a first inner partition that forms a portion of the oxidation space and a portion of the etching space, the plurality of substrates inside the oxidation space are transferred to the etching space through a space in which the first inner partition was disposed.

7. The substrate processing method according to claim 1, further comprising:
   transferring the plurality of substrates inside the etching space to the oxidation space; and
   performing, after the supplying of the etching liquid to the plurality of substrates, drying of the plurality of substrates inside the oxidation space.

8. The substrate processing method according to claim 1, further comprising:
   moving a second inner partition that forms a portion of a drying space inside the substrate processing apparatus differing from the oxidation space and the etching space and a portion of the oxidation space or the etching space and thereafter transferring the plurality of substrates inside the etching space to the drying space through a space in which the second inner partition was disposed; and
   performing, after the supplying of the etching liquid to the plurality of substrates, drying of the plurality of substrates inside the drying space.

9. The substrate processing method according to claim 1, further comprising:
   supplying, after the supplying of the etching liquid to the plurality of substrates, the plurality of substrates with a rinse liquid that is a liquid of the same name as the etching liquid but differs from the etching liquid.

* * * * *